(12) United States Patent
Tamada et al.

(10) Patent No.: US 9,899,328 B2
(45) Date of Patent: Feb. 20, 2018

(54) POWER SEMICONDUCTOR MODULE

(71) Applicant: MITSUBISHI ELECTRIC CORPORATION, Chiyoda-ku (JP)

(72) Inventors: Yoshiko Tamada, Chiyoda-ku (JP); Junichi Nakashima, Chiyoda-ku (JP); Yasushi Nakayama, Chiyoda-ku (JP); Yukimasa Hayashida, Fukuoka (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/117,327

(22) PCT Filed: Jun. 30, 2014

(86) PCT No.: PCT/JP2014/003464
§ 371 (c)(1),
(2) Date: Aug. 8, 2016

(87) PCT Pub. No.: WO2015/121899
PCT Pub. Date: Aug. 20, 2015

(65) Prior Publication Data
US 2016/0351505 A1    Dec. 1, 2016

(30) Foreign Application Priority Data
Feb. 11, 2014    (JP) ................. 2014-023922

(51) Int. Cl.
*H01L 23/50*    (2006.01)
*H01L 23/538*    (2006.01)
(Continued)

(52) U.S. Cl.
CPC .......... *H01L 23/5386* (2013.01); *H01L 23/50* (2013.01); *H01L 23/5385* (2013.01);
(Continued)

(58) Field of Classification Search
CPC .................................................. H02M 7/003
See application file for complete search history.

(56) References Cited

U.S. PATENT DOCUMENTS

| | | | | |
|---|---|---|---|---|
| 2010/0117570 A1* | 5/2010 | Nishimori | ............. | H02M 7/003 318/400.3 |
| 2013/0021831 A1* | 1/2013 | Kitabatake | .......... | H02M 7/5387 363/131 |

FOREIGN PATENT DOCUMENTS

| | | |
|---|---|---|
| JP | 58-131759 A | 8/1983 |
| JP | H07-022510 A | 1/1995 |

(Continued)

OTHER PUBLICATIONS

International Search Report dated Sep. 2, 2014 in PCT/JP2014/003464 filed Jun. 30, 2014.

(Continued)

*Primary Examiner* — Charles Garber
*Assistant Examiner* — Alia Sabur
(74) *Attorney, Agent, or Firm* — Oblon, McClelland, Maier & Neustadt, L.L.P.

(57) ABSTRACT

A power semiconductor module includes: a positive arm and a negative arm that are formed by series connection of self-arc-extinguishing type semiconductor elements, the positive arm and the negative arm being connected at a series connection point between the self-arc-extinguishing type semiconductor elements; a positive-side electrode, a negative-side electrode, and an AC electrode connected to the positive arm and the negative arm; and a substrate on which a plurality of wiring patterns are formed, the wiring patterns connecting the self-arc-extinguishing type semiconductor elements of the positive arm and the negative arm to the positive-side electrode, the negative-side electrode, and the AC electrode. Respective directions of current flowing in adjacent wiring patterns are identical to each other, and one (Continued)

of the adjacent wiring patterns is arranged in mirror symmetry with the other of the adjacent wiring patterns.

17 Claims, 13 Drawing Sheets

(51) Int. Cl.
*H01L 25/07* (2006.01)
*H01L 25/18* (2006.01)
*H02M 1/088* (2006.01)
*H02M 7/00* (2006.01)
*H05K 7/14* (2006.01)
*H01L 23/66* (2006.01)
*H01L 23/00* (2006.01)

(52) U.S. Cl.
CPC .............. *H01L 23/66* (2013.01); *H01L 24/48* (2013.01); *H01L 24/49* (2013.01); *H01L 25/07* (2013.01); *H01L 25/18* (2013.01); *H02M 1/088* (2013.01); *H02M 7/003* (2013.01); *H05K 7/1432* (2013.01); *H01L 2223/6611* (2013.01); *H01L 2224/0603* (2013.01); *H01L 2224/48091* (2013.01); *H01L 2224/48111* (2013.01); *H01L 2224/48139* (2013.01); *H01L 2224/48227* (2013.01); *H01L 2224/49113* (2013.01); *H01L 2224/49175* (2013.01); *H01L 2224/73265* (2013.01); *H01L 2924/00014* (2013.01); *H01L 2924/1033* (2013.01); *H01L 2924/10254* (2013.01); *H01L 2924/10272* (2013.01); *H01L 2924/1203* (2013.01); *H01L 2924/1305* (2013.01); *H01L 2924/13055* (2013.01); *H01L 2924/13091* (2013.01); *H01L 2924/181* (2013.01); *H01L 2924/19107* (2013.01)

(56) References Cited

FOREIGN PATENT DOCUMENTS

| | | | |
|---|---|---|---|
| JP | 2001-102519 A | | 4/2001 |
| JP | 2001102519 A | * | 4/2001 |
| JP | 3519227 B2 | | 4/2004 |
| JP | 3521651 B2 | | 4/2004 |
| JP | 2007110870 A | * | 4/2007 |
| JP | 2008-288445 A | | 11/2008 |
| JP | 2010-016122 A | | 1/2010 |
| WO | WO2010/038541 A | | 4/2010 |
| WO | 2013/128787 A1 | | 9/2013 |

OTHER PUBLICATIONS

Japanese Office Action with machine translation dated Oct. 3, 2017 in corresponding Japanese Patent Application No. 2015-562568.

* cited by examiner

POWER SEMICONDUCTOR MODULE

TECHNICAL FIELD

The present invention relates to a technique of suppressing a current unbalance of a power semiconductor module used in a power conversion device such as an inverter required to be reduced in size.

BACKGROUND ART

In an insulated-type power semiconductor module used for a power conversion device such as an inverter, a wiring pattern is formed on a metal plate serving as a heat-radiation plate with an insulating layer interposed therebetween. On this wiring pattern, a power semiconductor element configured to perform a switching operation is provided. This power semiconductor element is connected to an external terminal and sealed with resin.

In the power conversion device performing a switching operation at a large current and a high voltage, a surge voltage (ΔV=L·di/dt) determined by a rate of change of current with time di/dt when the power semiconductor element is turned off and a parasitic inductance L included in the power conversion device is generated, and this surge voltage is applied to the power semiconductor element. As parasitic inductance L increases, a surge voltage exceeding the breakdown voltage of the power semiconductor element is generated, which may lead to breakage of the power semiconductor element. Accordingly, the power conversion device needs to be reduced in inductance and the power semiconductor module also needs to be reduced in inductance.

A required current capacity of the power conversion device has been satisfied by selecting a power semiconductor module which meets the required current capacity, or using a plurality of power semiconductor modules connected in parallel if such a power semiconductor module is unavailable. However, if a plurality of power semiconductor modules connected in parallel are used, it is necessary to separate the modules from each other for keeping an insulation distance between the modules, which results in a disadvantage of increase of the footprint.

This disadvantage may be solved by arranging power semiconductor elements in a multi-parallel array within the same package (see PTD 1 for example). Even if a plurality of external terminals are provided for connection with an external circuit as disclosed in PTD 1, the effect of reducing the inductance is not sufficient in the case where respective terminals of the plurality of power semiconductor elements arranged in the multi-parallel array in the same package are connected together, in the same package, to the external terminal. In this case, an increase of the current capacity is accompanied by an increase of di/di at the time of turn off and accordingly an increase of the surge voltage, possibly resulting in breakage of the power semiconductor elements.

In view of the above, inventors have invented a power semiconductor module having a plurality of external terminals and a plurality of circuits arranged in parallel in the power semiconductor module, aiming at reduction of the inductance of the power semiconductor element (see PTD 2 for example).

CITATION LIST

Patent Document

PTD 1: Japanese Patent No, 3519227 (page 3, FIGS. 2, 6)
PTD 2: WO2013/128787 (page 5, FIG. 1)

SUMMARY OF INVENTION

Technical Problem

In the case where the conventional power semiconductor module is used in a large-current and high-voltage application where more power semiconductor elements are arranged in a multi-parallel array than previous applications, a plurality of external terminals may be provided as disclosed in PTD 2 to enable reduction of the inductance. There is also a case where a plurality of external terminals cannot be provided due to the requirement of the insulation distance between power semiconductor modules and it is inevitable to integrate some external terminals into one external terminal. It has later been found through studies of inventors that such a power semiconductor module in which power semiconductor elements are multi-parallel connected has a problem of occurrence of current unbalance between these power semiconductor elements The present invention has been made to solve the above-described problem. In the case where one external terminal is provided for each electric potential, the present invention arranges substrates on which different wiring patterns are mounted, so that adjacent substrates are in mirror symmetry, and accordingly achieves a power semiconductor module which can suppress current unbalance while maintaining a low inductance.

Solution to Problem

A power semiconductor module of the present invention includes: a positive arm and a negative arm that are formed by series connection of self-arc-extinguishing type semiconductor elements, the positive arm and the negative arm being connected at a series connection point between the self-arc-extinguishing type semiconductor elements; a positive-side electrode, a negative-side electrode, and an AC electrode connected to the positive arm and the negative arm; and a substrate on which a plurality of wiring patterns are formed, the wiring patterns connecting the self-arc-extinguishing type semiconductor elements of the positive arm and the negative arm to the positive-side electrode, the negative-side electrode, and the AC electrode. Respective directions of current flowing in adjacent wiring patterns of the plurality of wiring patterns are identical to each other, and one of the adjacent wiring patterns is arranged in mirror symmetry with the other of the adjacent wiring patterns.

Advantageous Effects of Invention

In accordance with the present invention, the substrates on which different wiring patterns are mounted are arranged to be adjacent to each other in mirror symmetry. Therefore, adjacent wiring patterns are made uniform in terms of the current flowing therein, and the current unbalance between the substrates and between the power semiconductor elements can be suppressed.

DESCRIPTION OF EMBODIMENTS

First Embodiment

Figure 1:
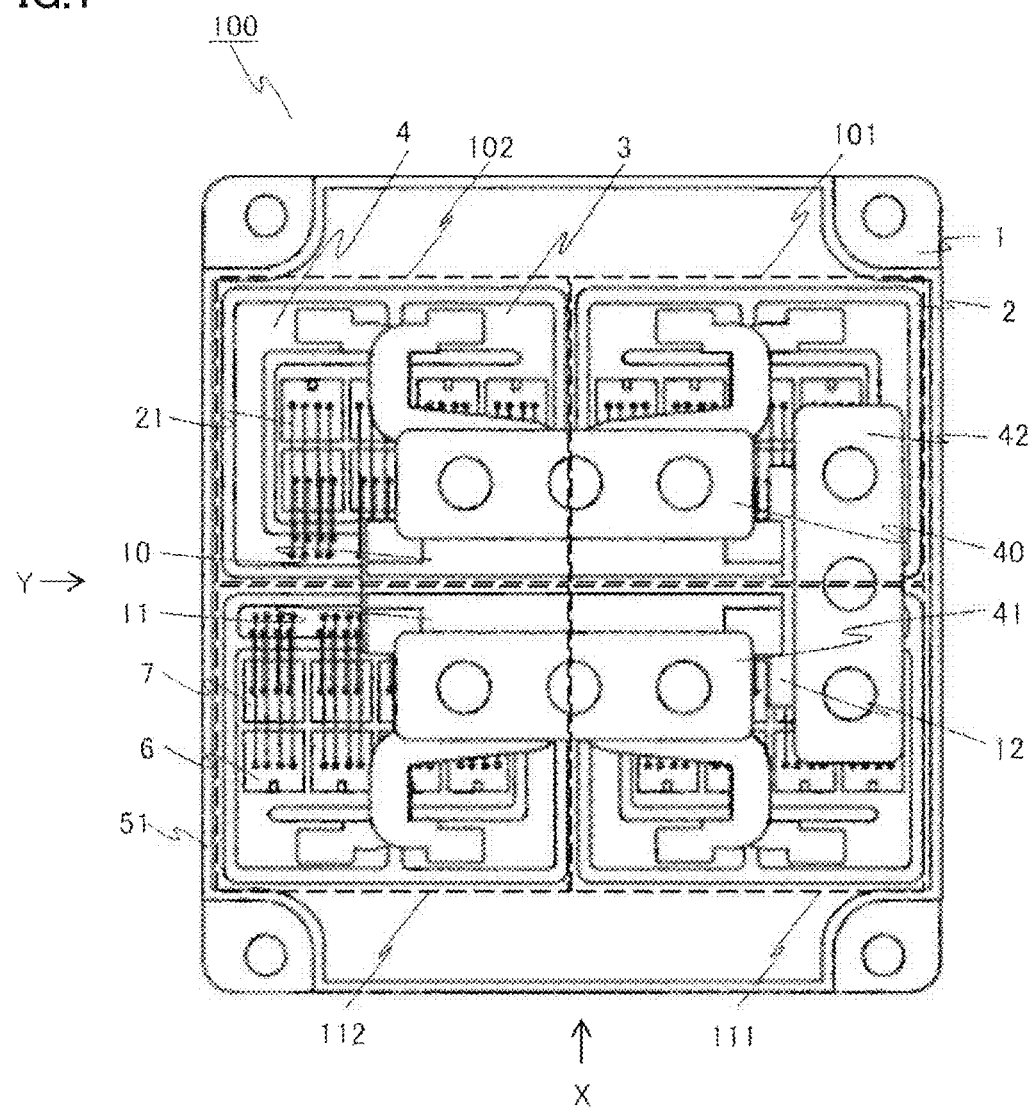
FIG. 1 is a top schematic diagram of a power semiconductor module in a first embodiment of the present invention.
Figure 2:
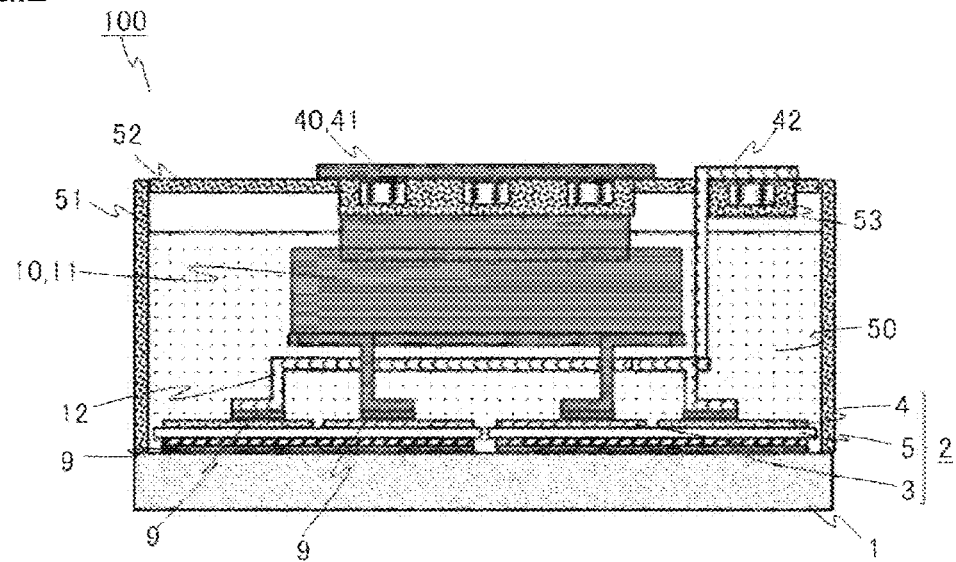
FIG. 2 is a schematic side view of the power semiconductor module in the first embodiment of the present invention.
Figure 3:
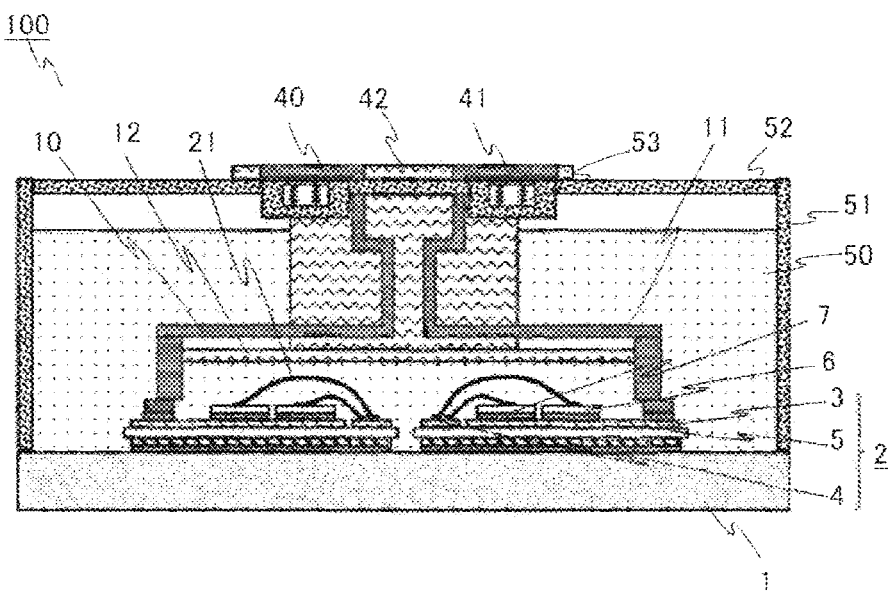
FIG. 3 is a schematic side view of the power semiconductor module in the first embodiment of the present invention.
Figure 4:
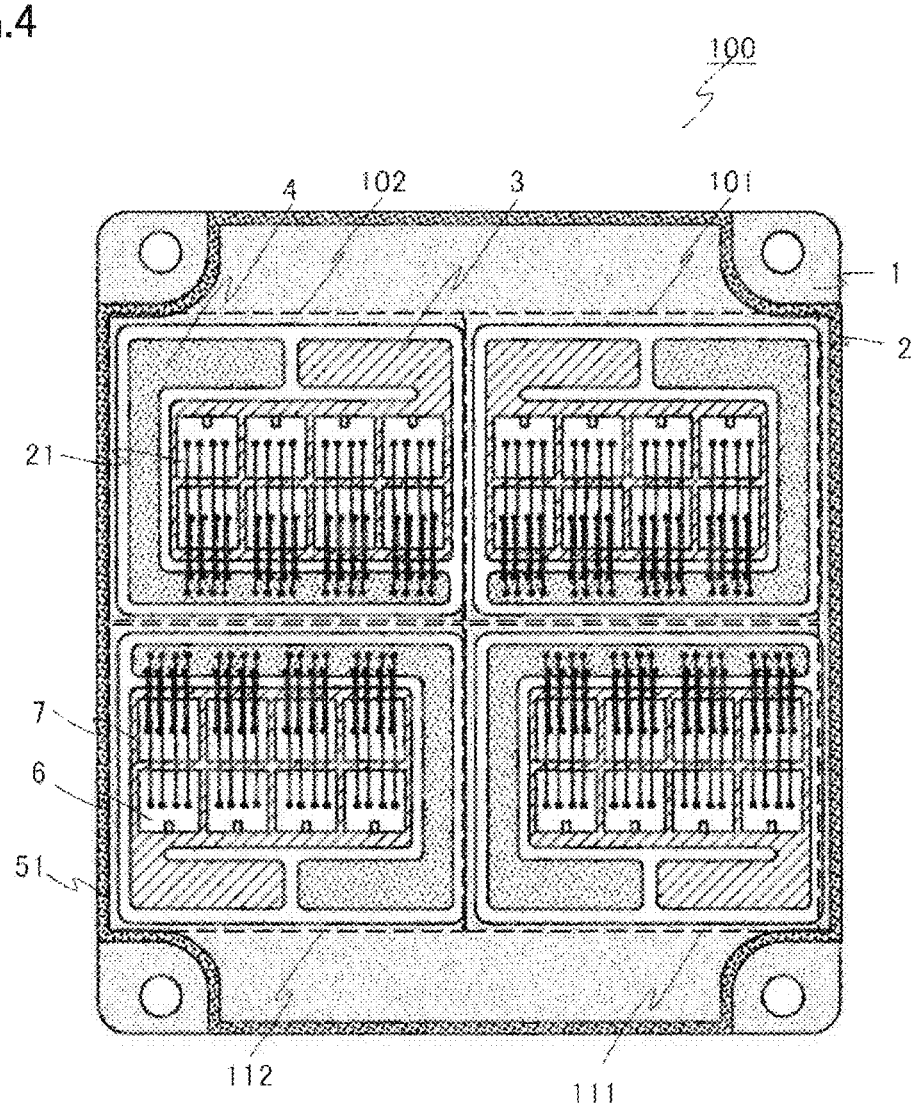
FIG. 4 is a top schematic diagram of the power semiconductor module in the first embodiment of the present invention, on which main electrodes are not shown.
Figure 5:
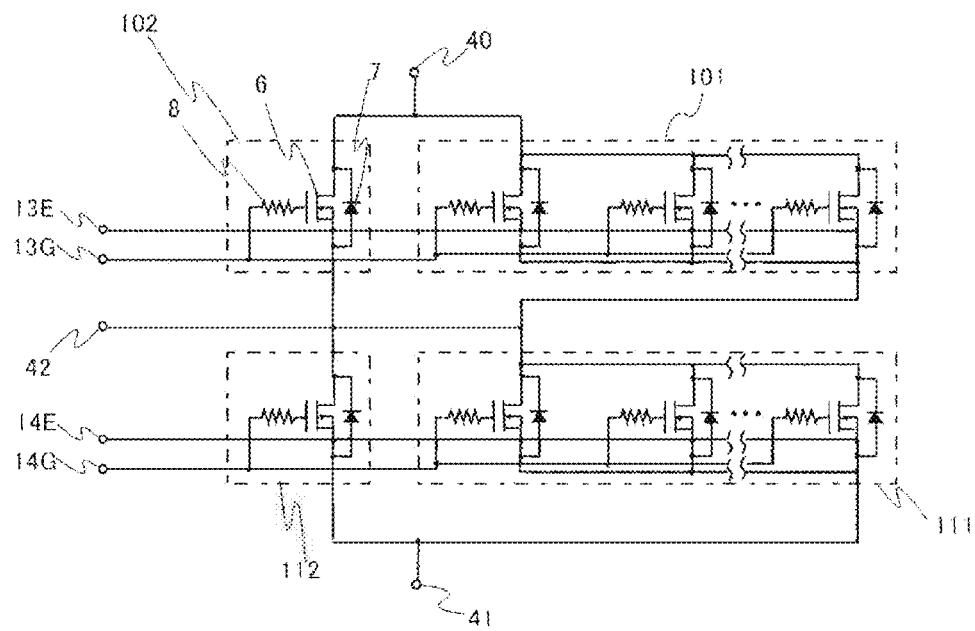
FIG. 5 is an equivalent circuit diagram of the power semiconductor module in the first embodiment of the present invention.

FIG. 1 is a top schematic diagram of a power semiconductor module in a first embodiment of the present invention. FIG. 2 is a schematic side view of the power semiconductor module in the first embodiment of the present invention. FIG. 3 is a schematic side view of the power semiconductor module in the first embodiment of the present invention. FIG. 2 shows the schematic side view as seen from the side indicated by X in FIG. 1, and FIG. 3 shows the schematic side view as seen from the side indicated by Y in FIG. 1. FIG. 4 is a top schematic diagram of the power semiconductor module in the first embodiment of the present invention, on which main electrodes (positive electrode, negative electrode, and AC electrode) are not shown, In FIG. 4, a chip layout of self-arc-extinguishing type semiconductor elements 6 and freewheel diodes 7 for example is shown, without the main electrodes shown in FIG. 1. FIG. 5 is an equivalent circuit diagram of the power semiconductor module in the first embodiment of the present invention. The direction as seen from the X side is herein defined as X direction and the direction as seen from the Y side is herein defined as Y direction.

In FIGS. 1 to 4, a power semiconductor module 100 in the first embodiment includes a base plate 1, an insulating substrate 2 serving as a substrate, a drain (collector) wiring pattern 3, a source (emitter) wiring pattern 4, a ceramic insulating substrate 5, a self-arc-extinguishing type semiconductor element 6, a freewheel diode 7, solder 9, a positive electrode 10 which is a positive-side electrode, a negative electrode 11 which is a negative-side electrode, an AC electrode 12, a bonding wire 21 which is a wiring member, a positive electrode terminal 40 which is a terminal portion of positive electrode 10, a negative electrode terminal 41 which is a terminal portion of negative electrode 11, an AC terminal 42 which is a terminal portion of AC electrode 12, a sealing material 50, a case 51, a cover 52, and a nut 53.

In power semiconductor module 100 of the first embodiment, ceramic insulating substrate 5, which is an insulator to which metal foil is bonded by brazing or the like, is bonded with solder 9 to one surface of base plate 1 which is a metal heat radiator that radiates heat generated by self-arc-extinguishing type semiconductor element 6 and freewheel diode 7 which are components of power semiconductor module 100. To the surface of ceramic insulating substrate 5 opposite to the surface thereof to which base plate 1 is bonded, wiring patterns 3, 4 are bonded with metal foil by brazing or the like. Ceramic insulating substrate 5 to which metal foil is bonded and wiring patterns 3, 4 constitute insulating substrate 2. The material for the insulating substrate is not limited to the ceramic material and the insulating substrate may be a metal substrate for which a resin insulating material is used. In the case of the metal substrate for which a resin insulating material is used, a single metal substrate for example may be used and a plurality of wiring patterns may be formed in mirror symmetry on this metal substrate, instead of using a plurality of insulating substrates for positive and negative arms. Even such a metal substrate for which a resin insulating material is used can produce similar effects. Moreover, as shown in FIG. or FIG. 4, wiring patterns are arranged in mirror symmetry as seen from above, and a line of this mirror symmetry is set between the wiring patterns in mirror symmetry.

On the surface of drain (collector) wiring pattern 3 and source (emitter) wiring pattern 4 opposite to the surface thereof to which ceramic insulating substrate 5 is bonded, self-arc-extinguishing type semiconductor element 6 and freewheel diode 7 are bonded with solder 9. Further, to drain (collector) wiring pattern 3 and source (emitter) wiring pattern 4, positive electrode 10, negative electrode 11, and AC electrode 12 are bonded. Although solder 9 is used as a bonding material, the bonding material is not limited to solder and any of other bonding methods may be used.

Since large current flows in each of positive electrode 10, negative electrode 11, and AC electrode 12, screws are commonly used for connecting them to an external circuit. The connection means, however, is not limited to screws, and any of other bonding methods may be used as long as large current can be flown. In the first embodiment, positive electrode 10, negative electrode 11, and AC electrode 12 are equipped respectively with positive electrode terminal 40 which is a terminal portion of positive electrode 10, negative electrode terminal 41 which is a terminal portion of negative electrode 11, and AC terminal 42 which is a terminal portion of AC electrode 12, and these terminals are provided on the upper surface of the module for connection to an external circuit. These positive electrode terminal 40, negative electrode terminal 41, and AC terminal 42 have respective screw insert holes, and cases embedded with respective nuts are disposed under these terminals. The external periphery of power semiconductor module 100 is surrounded with case 51, and sealing material 50 is injected into case 51 for electrically insulating the inside of case 51. After this, cover 52 is fit with case 51 and bonded thereto with an adhesive or the like.

The surface of self-arc-extinguishing type semiconductor element 6 and freewheel diode 7, which is not the surface bonded to the source (emitter) wiring pattern 4 with solder, is bonded to a wiring pattern or the like with bonding wire 21. Although the wire is used as a member for interconnecting them, it is not limited to wire and any of other bonding methods may be used.

In FIGS. 1 to 5, in power semiconductor module 100, two parallel circuits each called arm are connected in series. In each parallel circuit, self-arc-extinguishing type semiconductor element 6 and freewheel diode 7 which are power semiconductor elements are connected in anti-parallel with each other. The parallel circuits, namely a positive arm and a negative arm., constitute one phase of a power conversion circuit.

Power semiconductor module 100 of the present embodiment is a power semiconductor module generally called "two in one," namely the positive arm. and the negative arm are included in the same case (same package), The case forms the contour of the power semiconductor module. Although this is called case in the present embodiment, the case of a power semiconductor module having its contour formed by a sealant resin or the like is an outer peripheral portion of the resin, and this resin performs an equivalent function.

As shown in the equivalent circuit diagram of FIG. 5, the positive arm and the negative arm are configured in power semiconductor module 100, two blocks each enclosed by the dotted line are provided in each of the positive and negative arms, and thus there are four blocks in total. Further, as shown in a block 101 in the positive electrode side and a block 111 in the negative electrode side, one block includes a plurality of parallel-connected self-arc-extinguishing type semiconductor elements 6 and a plurality of parallel-connected freewheel diodes 7, and each self-arc-extinguishing type semiconductor element 6 is connected in anti-parallel with a corresponding freewheel diode 7. Although FIG. 5 shows a block 102 in the positive electrode side and a block 112 in the negative electrode side in a simplified form, these blocks are configured similarly to block 101 in the positive electrode side and block 111 in the negative electrode side.

Although the equivalent circuit diagram of FIG. 5 indicates self-arc-extinguishing type semiconductor element 6 as MOSFET (Metal-Oxide Semiconductor Field-Effect Transistor), self-arc-extinguishing type semiconductor element 6 is not limited to the MOSFET and may be any of other self-arc-extinguishing type semiconductor elements such as IGBT (Insulated Gate Bipolar Transistor) and bipolar transistor. Further, although freewheel diode 7 in the present embodiment is a diode element such as schottky barrier diode disposed externally to self-arc-extinguishing type semiconductor element 6, freewheel diode 7 may be a parasitic diode of self-arc-extinguishing type semiconductor element 6. Moreover, although FIG. 5 shows, in the equivalent circuit, a gate control circuit of self-arc-extinguishing type semiconductor elements 6, as well as a positive electrode gate 13G, a positive electrode control source 13E, a negative electrode gate 140, and a negative electrode control source 14E as terminals, FIGS. 1 to 4 relating to the internal structure of the module are given in a simplified form in which only the structure for circuits of the main circuitry is shown and the structure for the control circuit is not shown. Actually, a wiring pattern for control of self-arc-extinguishing type semiconductor element 6 is formed on insulating substrate 2, and a gate or control source electrode on self-arc-extinguishing type semiconductor element 6 is electrically connected to a gate or control source electrode provided for external connection to be exposed on the upper surface for example of the power semiconductor module and thereby enable connection with an external conductor. These facts are applied as well to other embodiments and do not influence the effects of the present invention. It should be noted, however, since the wiring pattern of the control circuit is prone to induction by main-circuit current of self-arc-extinguishing type semiconductor elements 6, namely current flowing in wiring patterns 3, 4, it is desirable that the wiring pattern of the control circuit is shaped so that the gate is in parallel with the control source, in order to suppress the an unbalance of current. Furthermore, the material for the semiconductor element is not limited to Si (Silicon) and the effects are obtained from any semiconductor element for which SiC (Silicon Carbide) or GaN (Gallium Nitride) or diamond is used as a raw material. Particularly in the case where SiC or GaN capable of high-speed operation is used, more distinguishing effects can be obtained.

As shown in FIG. 4, block 101 and block 102 are configured to include respective insulating substrates 2 on which a plurality of self-arc-extinguishing type semiconductor elements 6 and a plurality of freewheel diodes 7 are mounted and which are different in terms of arrangement of two types of wiring patterns 3, 4. These blocks are connected in parallel via main electrodes, namely positive electrode 10 and AC electrode 12, to form the positive arm, The negative arm is similar to this. Namely, block 111 and block 112 are configured to include respective insulating substrates 2 on which a plurality of self-arc-extinguishing type semiconductor elements 6 and a plurality of freewheel diodes 7 are mounted and which are different in terms of arrangement of two type of wiring patterns 3, 4. These blocks are connected in parallel via main electrodes, namely AC electrode 12 and negative electrode 11, to form the negative arm. Insulating substrate 2 has two types of wiring patterns, namely wiring pattern 3 on which self-arc-extinguishing type semiconductor elements 6 and freewheel diodes 7 are mounted, and wiring pattern 4 connected through bonding wire 21 to the source (emitter) of self-arc-extinguishing type semiconductor element 6 or to the anode of freewheel diode 7. A feature of the present invention is that wiring patterns 3, 4 of these two insulating substrates 2 are configured to be in mirror symmetry, namely block 101 and block 102 are in mirror symmetry and block 111 and block 112 are in mirror symmetry, in terms of arrangement of wiring patterns 3, 4.

Figure 6:
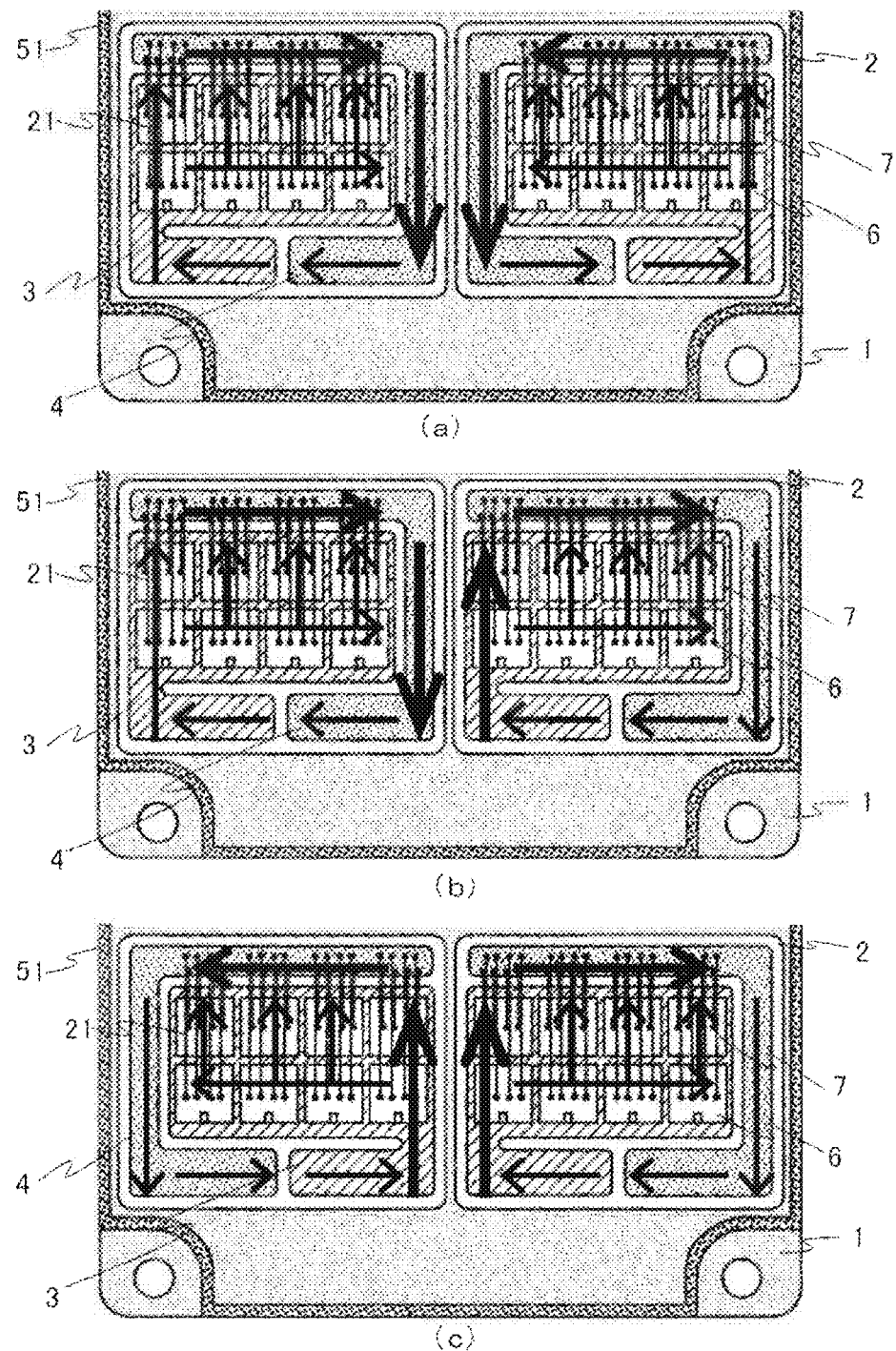
FIG. 6 is a diagram of current paths, at the time of commutation, through wiring patterns for example of an insulating substrate in a negative electrode side of the power semiconductor module in the first embodiment of the present invention.

FIG. 6 is a diagram of current paths, at the time of commutation, through wiring patterns for example of an insulating substrate in a negative electrode side of the power semiconductor module in the first embodiment of the present invention. FIG. 6 (a) shows a negative arm portion including laterally arranged insulating substrates 2 in which wiring patterns are arranged in mirror symmetry (mirror symmetry insulating substrates). FIG. 6 (b) shows a negative arm portion including laterally arranged insulating substrates 2 which are identical to each other in terms of arrangement of wiring patterns (the same insulating substrates). FIG. 6 (c) shows a negative arm portion including laterally arranged insulating substrates 2 in which wiring patterns are arranged in mirror symmetry (mirror symmetry insulating substrates), and the right and left insulating substrates in FIG. 6 (a) are identical respectively to the left and right insulating substrates in FIG. 6 (c). Effects of the present invention will be described with reference to FIG. 6. In FIG. 6, the direction of di/dt on a current path when self-arc-extinguishing type semiconductor element 6 is turned on is indicated by an arrow. In particular, di/dt indicated by extra-thick arrows causes interaction between respective wiring patterns of insulating substrates 2 adjacent to each other, In the case where insulating substrates 2, which are identical to each other in terms of arrangement of wiring patterns, are laterally arranged as shown in FIG. 6 (b), respective directions of extra-thick arrows indicating di/dt of current flowing in adjacent wiring patterns are opposite to each other. When di/dt is large like the one when self-arc-extinguishing type semiconductor element 6 is turned on/off, there is an effect that respective magnetic fluxes generated from the currents flowing in the opposite directions cancel each other. As to source wiring pattern 4 for self-arc-extinguishing type semiconductor elements 6 of the right insulating substrate 2 that is indicated by a thin arrow, because of the facts that this source wiring pattern 4 is not located close to source wiring pattern 4 of adjacent insulating substrate 2, that the current flowing in the opposite direction in the adjacent wiring pattern in the same insulating substrate 2 is small, and that the electrical conduction distance of the current is short, the effect that respective magnetic fluxes cancel each other is small. Namely, when a comparison is made between insulating substrates 2 adjacent to each other, source wiring pattern 4 for self-arc-extinguishing type semiconductor element 6 of the left insulating substrate 2 is smaller in parasitic inductance than source wiring pattern 4 of the right insulating substrate 2, and accordingly an unbalance of the parasitic inductance is generated between these left and right insulating substrates 2.

In contrast, in the case where insulating substrates 2 in which wiring patterns are arranged in mirror symmetry are laterally arranged as in the present embodiment in FIG. 6 (a), respective directions of the extra-thick arrows indicating di/dt of the current flowing in wiring patterns adjacent to each other are the same direction, and the effect that respective magnetic fluxes generated when di/dt is large cancel each other is not obtained. It is thus seen that the parasitic inductance occurring to the current path on which the extra-thick arrow is indicated is larger in the case where insulating substrates 2 where wiring patterns are arranged in mirror symmetry are laterally arranged, than in the case where insulating substrates 2 identical to each other in terms of arrangement of wiring patterns are laterally arranged. When a comparison is made between insulating substrates 2 adjacent to each other, these right and left insulating substrates 2 are identical to each other in terms of interaction on source wiring pattern 4 for self-arc-extinguishing type semiconductor elements 6 of insulating substrate 2, and thus in terms of parasitic inductance, because the wiring patterns are arranged in mirror symmetry.

Since the current flowing in self-arc-extinguishing type semiconductor element 6 is determined by the gate voltage, a problem in a power semiconductor module in which self-arc-extinguishing type semiconductor elements 6 are arranged in multi-parallel is variation of the gate voltage among self-arc-extinguishing type semiconductor elements 6, namely an unbalance of the current flowing in self-arc-extinguishing type semiconductor elements 6. It is necessary to reduce this current unbalance because the current unbalance affects the life of the power semiconductor module in a power cycle or the like. The variation of the gate voltage which causes this current unbalance is mostly due to variation of the potential of the source (emitter) among self-arc-extinguishing type semiconductor elements 6.

As descried above, there is a difference between FIG. 6 (a) and FIG. 6 (b) in terms of the degree of the unbalance, namely the unbalance of the parasitic inductance of source wiring pattern 4 for self-arc-extinguishing type semiconductor elements 6, between insulating substrates 2 adjacent to each other. In terms of the gate voltage, namely current, of self-arc-extinguishing type semiconductor elements 6 mounted on each of right and left insulating substrates 2, an unbalance is generated among self-arc-extinguishing type semiconductor elements 6 in FIG. 6 (b), while an unbalance is less likely to be generated among self-arc-extinguishing type semiconductor elements 6 in FIG. 6 (a). Namely, the wiring patterns arranged in mirror symmetry produce an effect of suppressing the unbalance of the current flowing in self-arc-extinguishing type semiconductor elements 6, between insulating substrates 2 adjacent to each other.

In FIG. 6 (c), source wiring pattern 4 is not located close to source wiring pattern 4 of adjacent insulating substrate 2, the current flowing in the opposite direction in the adjacent wiring pattern in the same substrate is small, and the electrical conduction distance of the current is short, Therefore, the effect that magnetic fluxes cancel each other is small. However, since the wiring patterns are arranged in mirror symmetry, the interaction on source wiring pattern 4 of left insulating substrate 2 is equivalent to the interaction on source wiring pattern 4 of right insulating substrate 2, and an unbalance of the parasitic inductance is less likely to occur between these wiring patterns, like the state shown in FIG. 6 (a). Thus, the unbalance of the current flowing in self-arc-extinguishing type semiconductor element 6 can be suppressed. As seen from the above, wiring patterns can be arranged in mirror symmetry to suppress the unbalance of current between insulating substrates 2. The arrangement of wiring patterns is not limited to those of FIG. 6 (a) and FIG. 6 (c), and the wiring patterns may be arranged in any manner as long as the wiring patterns are arranged in mirror symmetry.

While the above description is about the effect of suppressing the unbalance of current generated among a plurality of insulating substrates 2, the present invention also achieves an effect of suppressing an unbalance of current among a plurality of self-arc-extinguishing type semiconductor elements 6 within the same insulating substrate 2, as described in the following. Variation of the source potential among four self-arc-extinguishing type semiconductor elements 6 within the same insulating substrate 2 in the present embodiment is caused by parasitic inductance L of the current path indicated by a thick arrow in the lateral direction (Y direction) in FIG. 6 and by rate of change of current di/di. Therefore, if the parasitic inductance of source wiring pattern 4 connected in series with parasitic inductance L causing this variation, or the parasitic inductance of the main electrode is large, parasitic inductance L is relatively small and the variation of the source potential is accordingly small. As a result of this, the unbalance of the current flowing in self-arc-extinguishing type semiconductor element 6, among a plurality of self-arc-extinguishing type semiconductor elements 6 can be suppressed. As described above in connection with FIG. 6, in the case where the mirror symmetry insulating substrates are laterally arranged according to the present invention, the direction of di/dt in the wiring pattern is identical to the direction thereof in the adjacent wiring pattern, and therefore, the parasitic inductance of the series-connected current path indicated by the extra-thick arrow is larger and thus the parasitic inductance L is relatively smaller to enable reduction of the variation of the source potential, as compared with the case where the same insulating substrates are laterally arranged. As a result of this, the variation of the gate voltage among a plurality of self-arc-extinguishing type semiconductor elements 6 is suppressed, and the effect of suppressing the unbalance of current among a plurality of self-arc-extinguishing type semiconductor elements 6 is achieved. This effect regarding the unbalance of current among a plurality of self-arc-extinguishing type semiconductor elements 6 is limited to the mirror symmetry arrangement of wiring patterns as shown in FIG. 6 (a) and FIG. 6 (c).

In FIG. 6 (a), insulating substrates 2 in the same arm are arranged in parallel in the Y direction shown in FIG. 1, and self-arc-extinguishing type semiconductor elements 6 and freewheel diodes 7 are also aligned in the Y direction on insulating substrate 2. Accordingly, the aforementioned di/dt indicated by the thick arrow is in the Y direction and the aforementioned di/dt indicated by the extra-thick arrow is in the X direction. Therefore, the inductance of the current path indicated by the thick arrow is not affected by the suppression of the interaction by the mirror symmetry arrangement of insulating substrates 2. Namely, as shown in this structure, the path of current, which flows in the same direction as the direction in which self-arc-extinguishing type semiconductor elements 6 are aligned, extends perpendicularly to the current path extending further from the aforementioned path. Therefore, the parasitic inductance in the X direction is made larger and the parasitic inductance in the Y direction can be made relatively smaller, to thereby achieve the effect of suppressing the unbalance of current. As to FIG. 6 (c) as well, the parasitic inductance in the X direction is larger than the parasitic inductance in the X direction in FIG. 6 (b) and the parasitic inductance in the Y direction can be made relatively smaller, the effect of suppressing the unbalance of current is achieved, although the extent to which the parasitic inductance in the X direction is made larger in FIG. 6 (c) is smaller than that in FIG. 6 (a).

Further, in the present embodiment, insulating substrates 2 constituting the positive arm and insulating substrates 2 constituting the negative arm are arranged opposite in the X direction. Insulating substrates 2 constituting each arm can be of two types with the same mirror symmetry. Here, in the case where insulating substrates 2 of two types which are mirror symmetrical to each other are used, the positive arm and the negative arm can be configured in two different ways. In one of these ways, namely in the present embodiment, as shown in FIG. 4, insulating substrates 2 with the same wiring patterns are used in positive electrode block 101 and negative electrode block 111, and insulating substrates 2 with the same wiring patterns are used in positive electrode block 102 and negative electrode block 112. The two insulating substrates 2 are arranged opposite to each other in the X direction, and one of the insulating substrates 2 corresponds to the other rotated by 180°.

Figure 7:
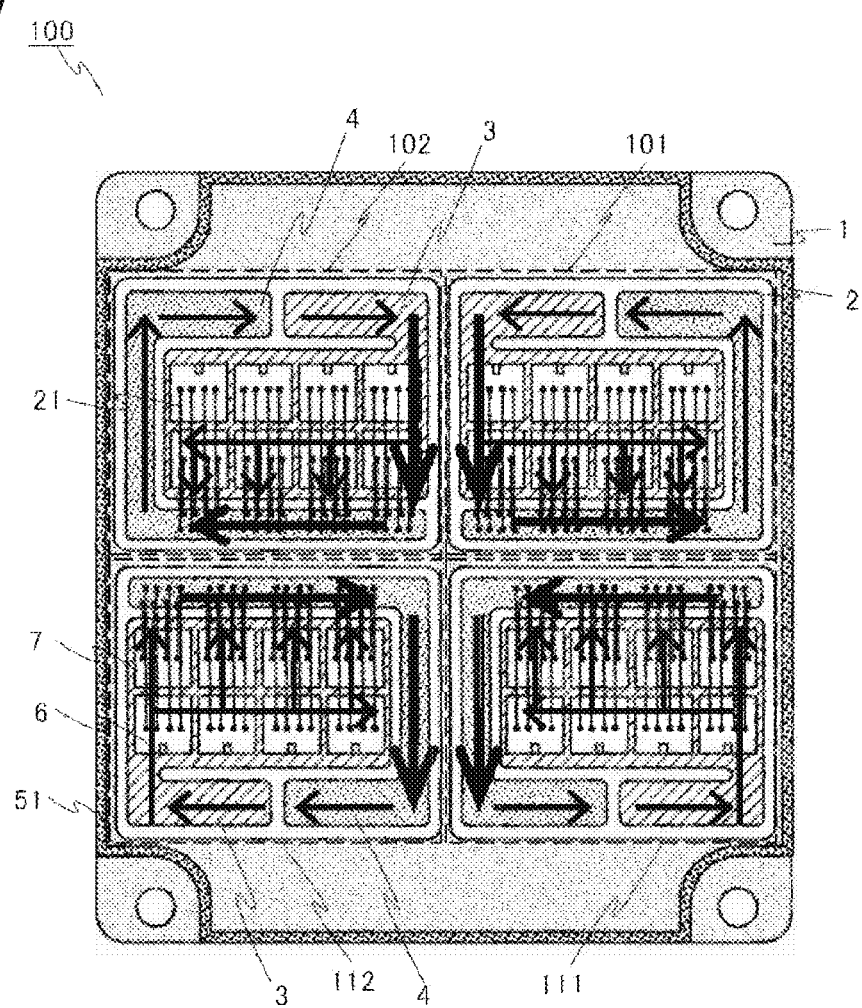
FIG. 7 is a diagram of current paths, at the time of commutation, through wiring patterns for example of the insulating substrate of the power semiconductor module in the first embodiment of the present invention.
Figure 8:
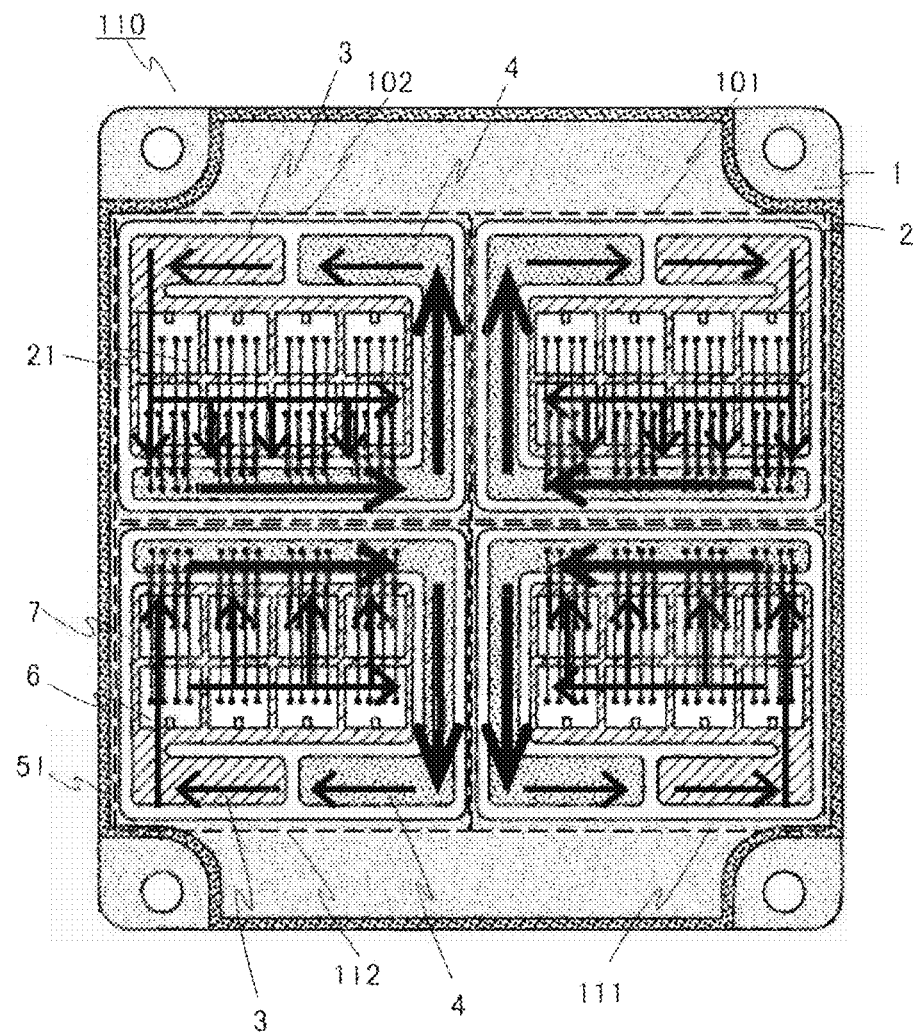
FIG. 8 is a diagram of current paths, at the time of commutation, through wiring patterns for example of an insulating substrate of another power semiconductor module in the first embodiment of the present invention.

FIG. 7 is a diagram of current paths, at the time of commutation, through wiring patterns for example of the insulating substrate of the power semiconductor module in the first embodiment of the present invention. In FIG. 7, the direction of di/dt on a current path (except for the main electrodes) in each of the positive arm and the negative arm of power semiconductor module 100 in the present embodiment is indicated by an arrow. FIG. 8 is a diagram of current paths, at the time of commutation, through wiring patterns for example of an insulating substrate of another power semiconductor module in the first embodiment of the present invention. In FIG. 8, the direction of di/dt on a current path (except for the main electrodes) in each of the positive arm and the negative arm of a power semiconductor module 110 in the present embodiment is indicated by an arrow. FIG. 8 shows another example configuration in which the arrangement in the positive arm is different from the example configuration shown in FIG. 7. In the configuration of FIG. 8, insulating substrate 2 used in positive block 101 is identical in wiring pattern to insulating substrate 2 of negative block 112, and insulating substrate 2 of positive block 102 is identical in wiring pattern to insulating substrate 2 of negative block 111. Namely, in the configuration of FIG. 8, insulating substrate 2 of the positive arm and adjacent insulating substrate 2 of the negative arm are also in mirror symmetry. The current paths shown in FIGS. 7 and 8 indicate di/di when large di/dt is generated at the time of commutation upon turn-on of self-arc-extinguishing type semiconductor elements 6 of the negative arm. On the contrary, in the current path at the time of commutation upon turn-on of self-arc-extinguishing type semiconductor elements 6 of the positive arm, current flows through self-arc-extinguishing type semiconductor elements 6 in the positive arm and current flows through freewheel diodes 7 in the negative arm, which is a difference from FIGS. 7 and 8, while the current path through the wiring patterns of insulating substrate 2 is substantially the same as that in FIGS. 7 and 8.

As to the direction of di/dt shown in FIG. 7, the directions of di/dt indicated by the extra-thick arrows on respective source wiring patterns 4 of adjacent insulating substrates 2 are identical to corresponding directions shown in FIG. 6 (c) in which source wiring patterns 4 are not adjacent to each other. Because of the facts that source wiring pattern 4 is not located close to source wiring pattern 4 of the adjacent insulating substrate 2, that the current flowing in the opposite direction in the adjacent wiring pattern in the same insulating substrate 2 is small, and that the electrical conduction distance of the current is short, the effect that respective magnetic fluxes cancel each other is small. However, since the wiring patterns are arranged in mirror symmetry, the interaction on source wiring pattern 4 of left insulating substrate 2 is equivalent to the interaction on source wiring pattern 4 of right insulating substrate 2, and the effect of suppressing the unbalance of current is achieved similarly to the case shown in FIG. 6 (c). The negative arm in FIG. 7 is configured identically to the one shown in FIG. 6 (a). Specifically, source wiring patterns 4 are adjacent to each other, respective directions of di/dt are identical to each other, the parasitic inductance of the current paths indicated by the extra-thick arrows increases, and thus a similar effect to the effect of suppressing the unbalance of current in the negative electrode side shown in FIG. 6 (*a*) can be obtained. Meanwhile, the current path indicated by the thick arrow on the insulating substrate of the positive arm and the current path indicated by the thick arrow in the adjacent insulating substrate of the negative arm are adjacent to each other (mirror symmetry), while the direction of flowing current di/dt of one of these insulating substrates is opposite to that of the other insulating substrate. Therefore, the parasitic inductance of the current paths indicated by the thick arrows is small. Accordingly, in both the positive arm and the negative arm, the parasitic inductance of the current paths indicated by the thick arrows is reduced, thus the parasitic inductance of the current paths indicated by the thick arrows is relatively smaller than the parasitic inductance of the current paths indicated by the extra-thick arrows, and the variation of the source potential can thus be reduced. The unbalance of current flowing in self-arc-extinguishing type semiconductor elements 6 can therefore be suppressed.

In FIG. 8, since the wiring patterns in the positive arm and the negative arm are arranged in mirror symmetry, both the positive arm and the negative arm are capable of the same operation as that of the negative electrode side shown in FIG. 6 (*a*). Therefore, the current paths, which are indicated by the extra-thick arrows, of source wiring patterns 4 for self-arc-extinguishing type semiconductor elements 6 and freewheel diodes 7 do not have the effect of cancelling respective magnetic fluxes generated by di/dt of insulating substrates 2 adjacent to each other, and the parasitic inductance of the portion indicated by the extra-thick arrows is large. Accordingly, in both the positive arm and the negative arm, the parasitic inductance of the current path indicated by the extra-thick arrow is larger while the parasitic inductance of the current path indicated by the thick arrow is relatively smaller to thereby enable reduction of the variation of the source potential. It is therefore possible for the positive electrode side as well to achieve a similar effect to the effect of suppressing the unbalance of current flowing through self-arc-extinguishing type semiconductor elements 6. Moreover, since the positive arm and the negative arm are identical to each other in terms of arrangement of wiring patterns, respective directions of the thick arrows are identical to each other and the parasitic inductance of this portion indicated by the thick arrows increases. However, the amount of increase of the parasitic inductance of the portion indicated by the thick arrows is smaller than the amount of increase of the parasitic inductance of the portion indicated by the extra-thick arrows, which has no influence on the variation of the source potential. Further, since all opposite wiring patterns in the module are identical to each other, a uniform operation balance is obtained in the power semiconductor module, and a stable operation of the power semiconductor module can be performed. Thus, both the configurations of FIGS. 7 and 8 can produce the effect of suppressing the unbalance of current. In FIG. 7, the positive arm and the negative arm are configured differently. However, this negative arm may be configured identically to the positive arm, namely configured to correspond to FIG. 8 except that the right side and the left side are replaced with each other (where the negative arm of FIG. 7 is used). From this configuration as well, the effect of suppressing the unbalance of current can be obtained.

Moreover, as to the shape of the main electrodes, as shown in FIG. 1, positive electrode 10, negative electrode 11, and AC electrode 12 are arranged in a layered form. Then, even when the power semiconductor module has one terminal per electrode, positive electrode 10 and AC electrode 12 are arranged in a layered form on the insulating substrate or AC electrode 12 and negative electrode 11 are arranged in a layered form on the insulating substrate, and further positive electrode 10 and negative electrode 11 are be arranged in a layered form on the power semiconductor module. In this way, the parasitic inductance of the power semiconductor module can be reduced.

In the power semiconductor module configured in the above-described manner, substrates on which different wiring patterns are mounted are arranged adjacent to each other so that the substrates are in mirror symmetry with each other. Therefore, adjacent wiring patterns can be made uniform in terms of current flowing in the wiring patterns. As a result of this, the unbalance of current between substrates and between power semiconductor elements can be suppressed and the reliability of the power semiconductor module can be improved.

Moreover, two types of substrates in which different wiring patterns are formed are used and arranged in mirror symmetry. Therefore, the number of substrates constituting the power semiconductor module can be reduced, and the cost of the power semiconductor module can be reduced while suppressing the unbalance of current between substrates and between power semiconductor elements.

Further, in the case of a metal substrate for which a resin insulating material is used, a plurality of different wiring patterns are arranged adjacently to each other on one substrate so that the wiring patterns are in mirror symmetry. Therefore, the number of substrates can be reduced, and the cost of the power semiconductor module can be reduced while suppressing the unbalance of current between substrates and between power semiconductor elements.

Second Embodiment

A second embodiment differs from the first embodiment in that while a pair of mirror-symmetry positive and negative arms is used in the first embodiment, a plurality of pairs of such mirror-symmetry positive and negative arms are arranged in the second embodiment. A plurality of pairs of mirror-symmetry positive and negative arms can thus be arranged to suppress, in the portions arranged in mirror symmetry in each arm, an unbalance of current flowing in self-arc-extinguishing type semiconductor elements.

Figure 9:
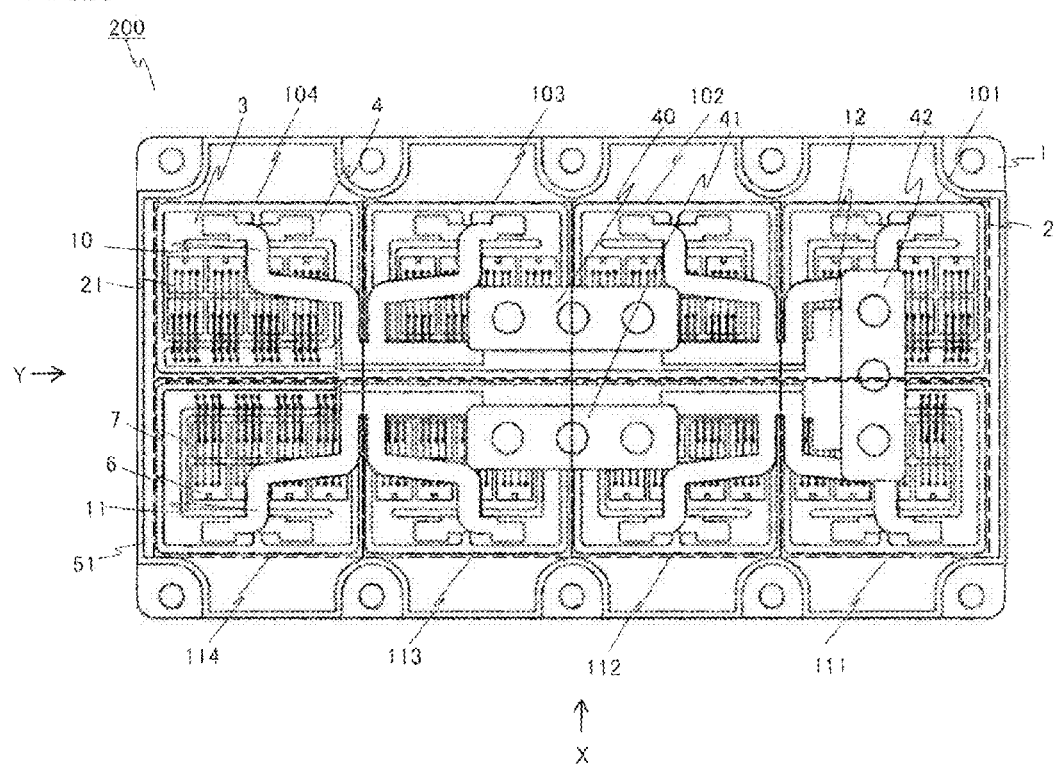
FIG. 9 is a top schematic diagram of a power semiconductor module in a second embodiment of the present invention.
Figure 10:
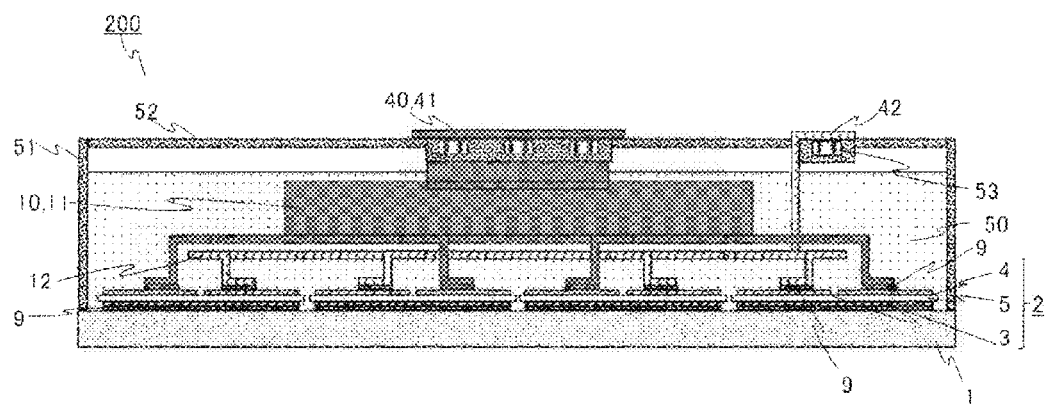
FIG. 10 is a schematic side view of the power semiconductor module in the second embodiment of the present invention.
Figure 11:
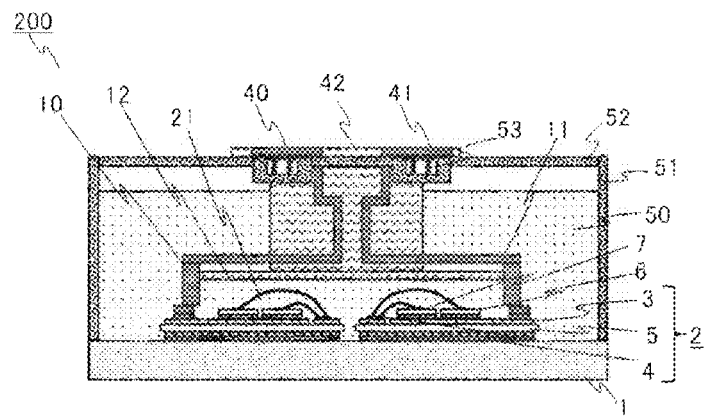
FIG. 11 is a schematic side view of the power semiconductor module in the second embodiment of the present invention.
Figure 12:
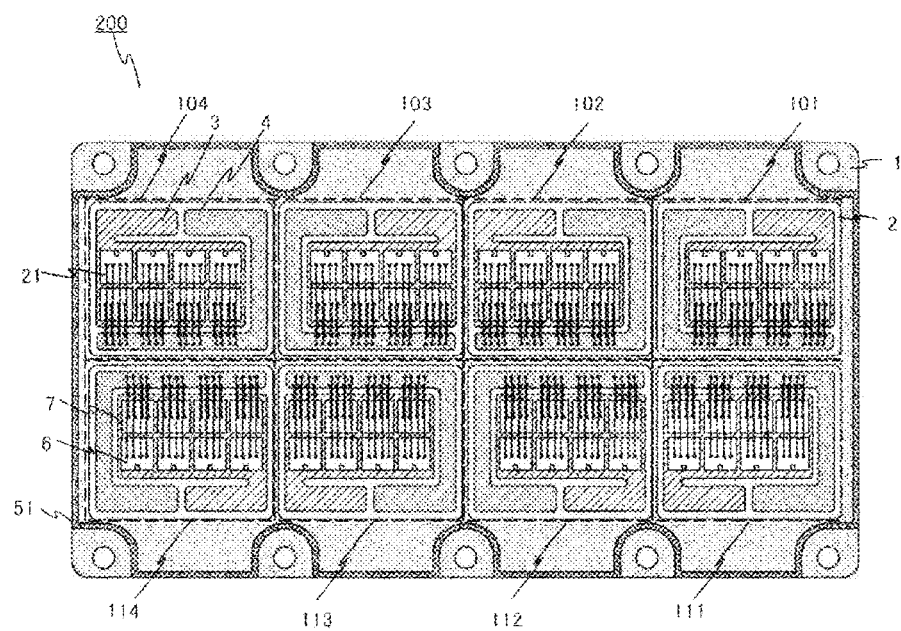
FIG. 12 is a top schematic diagram of the power semiconductor module in the second embodiment of the present invention, on which main electrodes are not shown.
Figure 13:
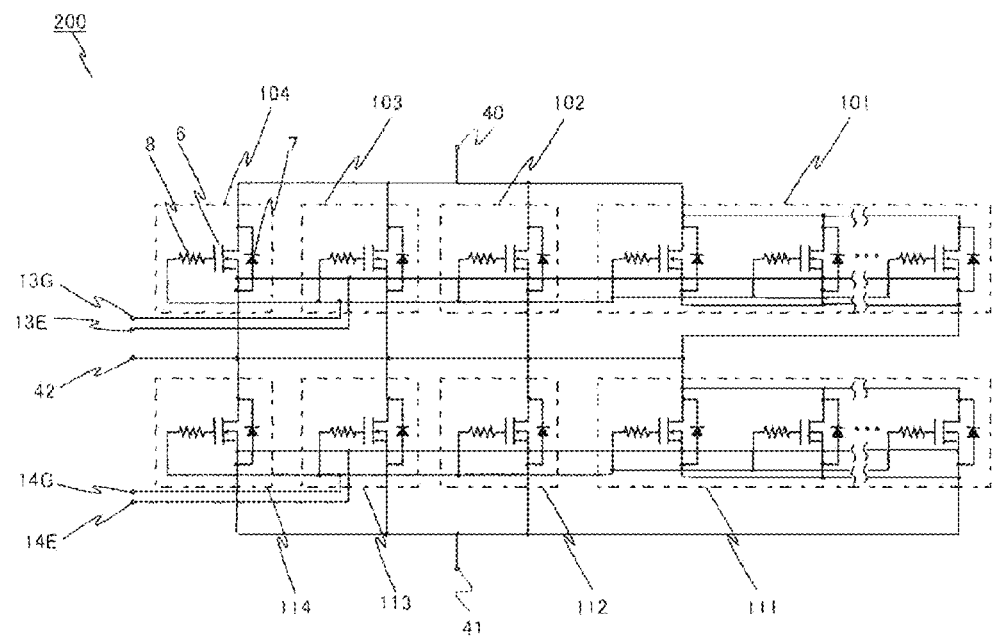
FIG. 13 is an equivalent circuit diagram of the power semiconductor module in the second embodiment of the present invention.

FIG. 9 is a top schematic diagram of a power semiconductor module in the second embodiment of the present invention. FIG. 0 is a schematic side view of the power semiconductor module in the second embodiment of the present invention. FIG. 11 is a schematic side view of the power semiconductor module in the second embodiment of the present invention. FIG. 10 shows the schematic side view as seen from the side indicated by X in FIG. 9, and FIG. 11 shows the schematic side view as seen from the side indicate by Y in FIG. 9. FIG. 12 is a top schematic diagram of the power semiconductor module in the second embodiment of the present invention, on which main electrodes (positive electrode, negative electrode, and AC electrode) are not shown. In FIG. 12, a chip layout of self-arc-extinguishing type semiconductor elements 6 and freewheel diodes 7 for example is shown, without the main electrodes shown in FIG. 9. FIG. 13 is an equivalent circuit diagram of the power semiconductor module in the first embodiment of the present invention. The direction as seen from the X side is herein defined as X direction and the direction as seen from the Y side is herein defined as Y direction.

In FIGS. 9 to 12, a power semiconductor module 200 in the second embodiment includes a base plate 1, an insulating substrate 2 serving as a substrate, a drain (collector) wiring pattern 3, a source (emitter) wiring pattern 4, a ceramic insulating substrate 5, a self-arc-extinguishing type semiconductor element 6, a freewheel diode 7, solder 9, a positive electrode 10 which is a positive-side electrode, a negative electrode 11 which is a negative-side electrode, an AC electrode 12, a bonding wire 21 which is a wiring member, a positive electrode terminal 40 which is a terminal portion of positive electrode 10, a negative electrode terminal 41 which is a terminal portion of negative electrode 11, an AC terminal 42 which is a terminal portion of AC electrode 12, a sealing material 50, a case 51, a cover 52, and a nut 53.

In power semiconductor module 200 of the second embodiment, ceramic insulating substrate 5, which is an insulator to which metal foil is bonded by brazing or the like, is bonded with solder 9 to one surface of base plate 1 which is a metal heat radiator that radiates heat generated by self-arc-extinguishing type semiconductor element 6 and freewheel diode 7 which are components of power semiconductor module 200. To the surface of ceramic insulating substrate 5 opposite to the surface thereof to which base plate 1 is bonded, wiring patterns 3, 4 are bonded with metal foil by brazing or the like. Ceramic insulating substrate 5 to which metal foil is bonded and wiring patterns 3, 4 constitute insulating substrate 2. The material for the insulating substrate is not limited to the ceramic material and the insulating substrate may be a metal substrate for which a resin insulating material is used. In the case of the metal substrate for which a resin insulating material is used, a single metal substrate for example may be used and a plurality of wiring patterns may be formed in mirror symmetry on this metal substrate, instead of using a plurality of insulating substrates for positive and negative arms. Even such a metal substrate for which a resin insulating material is used can produce similar effects.

On the surface of drain (collector) wiring pattern 3 and source (emitter) wiring pattern 4 opposite to the surface thereof to which ceramic insulating substrate 5 is bonded, self-arc-extinguishing type semiconductor element 6 and freewheel diode 7 are bonded with solder 9. Further, to drain (collector) wiring pattern 3 and source (emitter) wiring pattern 4, positive electrode 10, negative electrode 11, and AC electrode 12 are bonded. Although solder 9 is used as a bonding material, the bonding material is not limited to solder and any of other bonding methods may be used.

Since large current flows in each of positive electrode 10, negative electrode 11, and AC electrode 12, screws are commonly used for connecting them to an external circuit. The connection means, however, is not limited to screws, and any of other bonding methods may be used as long as large current can be flown. In the second embodiment, positive electrode 10, negative electrode 11, and AC electrode 12 are equipped respectively with positive electrode terminal 40 which is a terminal portion of positive electrode 10, negative electrode terminal 41 which is a terminal portion of negative electrode 11, and AC terminal 42 which is a terminal portion of AC electrode 12, and these terminals are provided on the upper surface of the module for connection to an external circuit. These positive electrode terminal 40, negative electrode terminal 41, and AC terminal 42 have respective screw insert holes, and cases embedded with respective nuts are disposed under these terminals. The periphery of power semiconductor module 200 is surrounded with case 51, and sealing material 50 is injected into case 51 for electrically insulating the inside of case 51. After this, cover 52 is fit with case 51 and bonded thereto with an adhesive or the like.

The surface of self-arc-extinguishing type semiconductor element 6 and freewheel diode 7, which is not the surface bonded to the source (emitter) wiring pattern 4 with solder, is bonded to a wiring pattern or the like with bonding wire 21. Although the wire is used as a wiring member, it is not limited to wire and any of other bonding methods may be used.

In FIGS. 9 to 13, in power semiconductor module 200, two parallel circuits each called arm are connected in series. In each parallel circuit, self-arc-extinguishing type semiconductor element 6 and freewheel diode 7 which are power semiconductor elements are connected in anti-parallel with each other. The parallel circuits, namely a positive arm and a negative arm., constitute one phase of a power conversion circuit.

Power semiconductor module 200 of the present embodiment is a power semiconductor module generally called "two in one," namely the positive arm and the negative arm are included in the same case (same package), The case forms the contour of the power semiconductor module. Although this is called case in the present embodiment, the case of a power semiconductor module having its contour formed by a sealant resin or the like is an outer peripheral portion of the resin, and this resin performs an equivalent function.

As shown in the equivalent circuit diagram of FIG. 13, the positive arm and the negative arm are configured in power semiconductor module 200, four blocks each enclosed by the dotted line are provided in each of the positive and negative arms, and thus there are eight blocks in total. Further, as shown in a block 101 in the positive electrode side and a block 111 in the negative electrode side, one block includes a plurality of parallel-connected self-arc-extinguishing type semiconductor elements 6 and a plurality of parallel-connected freewheel diodes 7, and each self-arc-extinguishing type semiconductor element 6 is connected in anti-parallel with a corresponding freewheel diode 7. Although FIG. 13 shows blocks 102 to 104 in the positive electrode side and blocks 112 to 114 in the negative electrode side in a simplified form, these blocks are configured similarly to block 101 in the positive electrode side and block 111 in the negative electrode side.

Although the equivalent circuit diagram of FIG. 13 indicates self-arc-extinguishing type semiconductor element 6 as MOSFET (Metal-Oxide Semiconductor Field-Effect Transistor), self-arc-extinguishing type semiconductor element 6 is not limited to the MOSFET and may be any of other self-arc-extinguishing type semiconductor elements such as IGBT (Insulated Gate Bipolar Transistor) and bipolar transistor. Further, although freewheel diode 7 in the present embodiment is a diode element such as schottky barrier diode disposed externally to self-arc-extinguishing type semiconductor element 6, freewheel diode 7 may be a parasitic diode of self-arc-extinguishing type semiconductor element 6. Moreover, although FIG. 13 shows, in the equivalent circuit, a gate control circuit of self-arc-extinguishing type semiconductor elements 6, as well as a positive electrode gate 13G, a positive electrode control source 13E, a negative electrode gate 14G, and a negative electrode control source 14E as terminals, FIGS. 9 to 12 relating to the internal structure of the module are given in a simplified form in which only the structure for circuits of the main circuitry is shown and the structure for the control circuit is not shown. Actually, a wiring pattern for control of self-arc-extinguishing type semiconductor element 6 is formed on insulating substrate 2, and a gate or control source electrode of self-arc-extinguishing type semiconductor element 6 is electrically connected to a gate or control source electrode provided for external connection to be exposed on the upper surface for example of the power semiconductor module and thereby enable connection with an external conductor. These facts are applied as well to other embodiments and do not influence the effects of the present invention. It should be noted, however, since the wiring pattern of the control circuit is prone to induction by main-circuit current of self-arc-extinguishing type semiconductor elements 6, namely current flowing in wiring patterns 3, 4, it is desirable that the wiring pattern of the control circuit is shaped so that the gate is in parallel with the control source, in order to suppress the unbalance of current. Furthermore, the material for the semiconductor element is not limited to Si (Silicon) and the effects are obtained from any semiconductor element for which SiC (Silicon Carbide) or GaN (Gallium Nitride) or diamond is used as a raw material. Particularly in the case where SiC or GaN capable of high-speed operation is used, more distinguishing effects can be obtained.

As shown in the equivalent circuit diagram of FIG. 13, the positive arm and the negative arm are configured in power semiconductor module 200, four blocks each enclosed by the dotted line are included in each of the positive and negative arms, and there are eight blocks in total. Namely, the second embodiment is different from the first embodiment in terms of the number of blocks.

As shown in FIG. 12, blocks 101 to 104 are configured to include respective insulating substrates 2 on which a plurality of self-arc-extinguishing type semiconductor elements 6 and a plurality of freewheel diodes 7 are mounted and which are different in terms of arrangement of two types of wiring patterns 3, 4. These blocks are connected in parallel via main electrodes, namely positive electrode 10 and AC electrode 12, to form the positive arm. The negative arm is similar to this. Namely, blocks 111 to 114 are configured to include respective insulating substrates 2 on which a plurality of self-arc-extinguishing type semiconductor elements 6 and a plurality of freewheel diodes 7 are mounted and which are different in terms of arrangement of two types of wiring patterns 3, 4. These blocks are connected in parallel via main electrodes, namely AC electrode 12 and negative electrode 11, to form the negative arm. Insulating substrate 2 has two types of wiring patterns, namely wiring pattern 3 on which self-arc-extinguishing type semiconductor elements 6 and freewheel diodes 7 are mounted, and wiring pattern 4 connected through bonding wire 21 to the source (emitter) of self-arc-extinguishing type semiconductor element 6 or to the anode of freewheel diode 7. A feature of the present invention is that wiring patterns 3, 4 of these two insulating substrates 2 are configured to be in mirror symmetry, namely insulating substrates adjacent to each other and included in the positive/negative arm are in mirror symmetry, in terms of arrangement of wiring patterns 3, 4.

Figure 14:
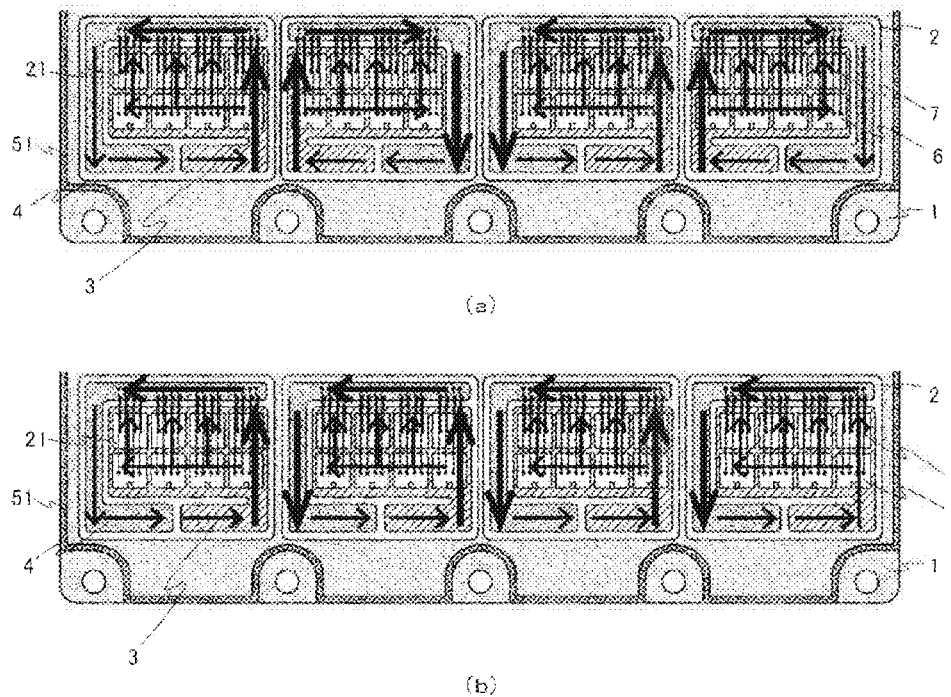
FIG. 14 is a diagram of current paths, at the time of commutation, through wiring patterns for example of an insulating substrate in a negative electrode side of the power semiconductor module in the second embodiment of the present invention.

FIG. 14 is a diagram of current paths, at the time of commutation, through wiring patterns for example of an insulating substrate of the negative electrode side of the power semiconductor module in the second embodiment of the present invention. FIG. 14 (*a*) shows a negative arm portion including laterally arranged insulating substrates 2 in which wiring patterns are arranged in mirror symmetry (mirror symmetry insulating substrates). FIG. 14 (*b*) shows a negative arm portion including laterally arranged insulating substrates 2 which are identical to each other in terms of arrangement of wiring patterns (the same insulating substrates). Similarly to the first embodiment, effects of the present invention will be described with reference to FIG. 14. In FIG. 14, the direction of di/dt on a current path when self-arc-extinguishing type semiconductor element 6 is turned on is indicated by an arrow. In particular, di/dt indicated by extra-thick arrows causes interaction between respective wiring patterns of insulating substrates 2 adjacent to each other.

In the case where insulating substrates 2, which are identical to each other in terms of arrangement of wiring patterns, are laterally arranged as shown in FIG. 14 (*b*), respective directions of extra-thick arrows indicating di/dt of current flowing in adjacent wiring patterns are opposite to each other. When di/dt is large like the one when self-arc-extinguishing type semiconductor element 6 is turned on/off, there is an effect that respective magnetic fluxes generated from the currents flowing in the opposite directions cancel each other. As to source wiring pattern 4 for self-arc-extinguishing type semiconductor elements 6 of the leftmost insulating substrate 2 that is indicated by a thin arrow, because of the facts that this source wiring pattern 4 is not located close to source wiring pattern 4 of the adjacent insulating substrate 2, that the current flowing in the opposite direction in the adjacent wiring pattern in the same insulating substrate 2 is small, and that the electrical conduction distance of the current is short, the effect that respective magnetic fluxes cancel each other is small. Namely, when a comparison is made among insulating substrates 2, source wiring pattern 4 for self-arc-extinguishing type semiconductor element 6 of the leftmost insulating substrate 2 is larger in parasitic inductance than source wiring patterns 4 of the remaining right insulating substrates 2, and accordingly an unbalance of current is generated among insulating substrates 2 disposed on the same base plate 1.

In contrast, in the case where substrates in which wiring patterns are arranged in mirror symmetry are laterally arranged as in the present embodiment in FIG. 14 (*a*), respective directions of the extra-thick arrows indicating di/dt of the current flowing in wiring patterns adjacent to each other are the same direction, and the effect that respective magnetic fluxes generated when di/dt is large cancel each other is not obtained. It is thus seen that the parasitic inductance occurring to the current path on which the extra-thick arrow is indicated is larger in the case where insulating substrates 2 where wiring patterns are arranged in mirror symmetry are laterally arranged, than in the case where insulating substrates 2 identical to each other in terms of arrangement of wiring patterns are laterally arranged. As to a pair of insulating substrates 2 adjacent to each other, when a comparison is made between right insulating substrate 2 and left insulating substrate 2 of this pair, these right and left insulating substrates 2 are identical to each other in terms of interaction on source wiring pattern 4 for self-arc-extinguishing type semiconductor elements 6 of insulating substrate 2, and thus in terms of parasitic inductance, because the wiring patterns are arranged in mirror symmetry. As a result of this, an unbalance of current is less likely to occur between right and left insulating substrates 2 of this pair. Further, although there is only one region where source wiring patterns 4 are adjacent to each other in FIG. 14 (*a*), a similar effect of suppressing the unbalance of current is also obtained from arrangement of insulating substrates 2 including two regions where source wiring patterns 4 are adjacent to each other.

As descried above, there is a difference between FIG. 14 (*a*) and FIG. 14 (*b*) in terms of the degree of the unbalance, namely the unbalance of the parasitic inductance of source wiring pattern 4 for self-arc-extinguishing type semiconductor elements 6, between insulating substrates 2 adjacent to each other. In terms of the gate voltage, namely current, of self-arc-extinguishing type semiconductor elements 6 mounted on insulating substrates 2 arranged on base plate 1, an unbalance is generated in FIG. 14 (*b*) because the wiring patterns are not arranged in mirror symmetry, while an unbalance is less likely to be generated in FIG. 14 (*a*) because the wiring patterns are arranged in mirror symmetry. Namely, the wiring patterns arranged in mirror symmetry produce an effect of suppressing the unbalance of the current flowing in self-arc-extinguishing type semiconductor elements 6, between insulating substrates 2 adjacent to each other.

Meanwhile, as described above in connection with the first embodiment, since the current of self-arc-extinguishing type semiconductor element 6 is determined by the gate voltage, a problem in a power semiconductor module in which self-arc-extinguishing type semiconductor elements 6 are arranged in multi-parallel is variation of the gate voltage among self-arc-extinguishing type semiconductor elements, namely an unbalance of the current flowing in self-arc-extinguishing type semiconductor elements 6. It is necessary to reduce this current unbalance because the current unbalance affects the life of the power semiconductor module in a power cycle or the like. The variation of the gate voltage which causes this current unbalance is mostly due to variation of the potential of the source (emitter) among self-arc-extinguishing type semiconductor elements 6.

While the above description is about the effect of suppressing the unbalance of current generated among a plurality of insulating substrates 2, the present invention also achieves an effect of suppressing an unbalance of current among a plurality of self-arc-extinguishing type semiconductor elements 6 within the same insulating substrate 2, as described in the following. Variation of the source potential (emitter) among four self-arc-extinguishing type semiconductor elements 6 within the same insulating substrate 2 in the present embodiment is caused by parasitic inductance L of the current path indicated by a thick arrow in FIG. 14 and by rate of change of current di/dt. Therefore, if the parasitic inductance of source wiring pattern 4 connected in series with the parasitic inductance causing this variation, or the parasitic inductance of the main electrode is large, parasitic inductance L is relatively small and the variation of the source potential is accordingly small. As a result of this, the unbalance of the current flowing in self-arc-extinguishing type semiconductor elements 6 can be suppressed. As described above in connection with FIG. 14, in the case where the mirror symmetry insulating substrates are arranged according to the present invention, the direction of current flowing in the wiring pattern is identical to the direction thereof in the adjacent wiring pattern, and therefore, the parasitic inductance of the series-connected current path indicated by the extra-thick arrow is larger and thus the parasitic inductance L is relatively smaller to enable reduction of the variation of the source potential, as compared with the case where the same insulating substrates are laterally arranged. As a result of this, the variation of the gate voltage among self-arc-extinguishing type semiconductor elements 6 is suppressed, and the effect of suppressing the unbalance of current among self-arc-extinguishing type semiconductor elements 6 is achieved.

In the present embodiment, like the first embodiment, insulating substrates 2 in the same arm in FIG. 14 (*a*) are arranged in parallel in the Y direction shown in FIG. 9, and self-arc-extinguishing type semiconductor elements 6 and freewheel diodes 7 are also aligned in the Y direction on insulating substrate 2. Accordingly, the aforementioned current path indicated by the thick arrow is in the Y direction and the aforementioned current path indicated by the extra-thick arrow is in the X direction. Therefore, the inductance of the current path indicated by the thick arrow is not affected by the suppression of the interaction by the mirror symmetry arrangement. Namely, as shown in this structure, the path of current, which flows in the same direction as the direction in which self-arc-extinguishing type semiconductor elements 6 are aligned, extends perpendicularly to the current path extending further from the aforementioned path. Therefore, the parasitic inductance in the X direction is made larger and the parasitic inductance in the Y direction can be made relatively smaller, to thereby achieve the effect of suppressing the unbalance of current.

Further, in the present embodiment, insulating substrates 2 constituting the positive arm and insulating substrates 2 constituting the negative arm are arranged opposite in the X direction. Insulating substrates 2 constituting each arm can be of two types with the same mirror symmetry. Here, in the case where insulating substrates 2 of two types which are mirror symmetrical to each other are used, the positive arm and the negative arm can be configured in two different ways. In one of these ways, namely in the present embodiment, as shown in FIG. 12, an insulating substrate in the positive arm and an adjacent insulating substrate in the negative arm (101 and 111 for example) are the same insulating substrates 2 and opposite to each other in the X direction, and one of the insulating substrates 2 corresponds to the other rotated by 180°.

Figure 15:
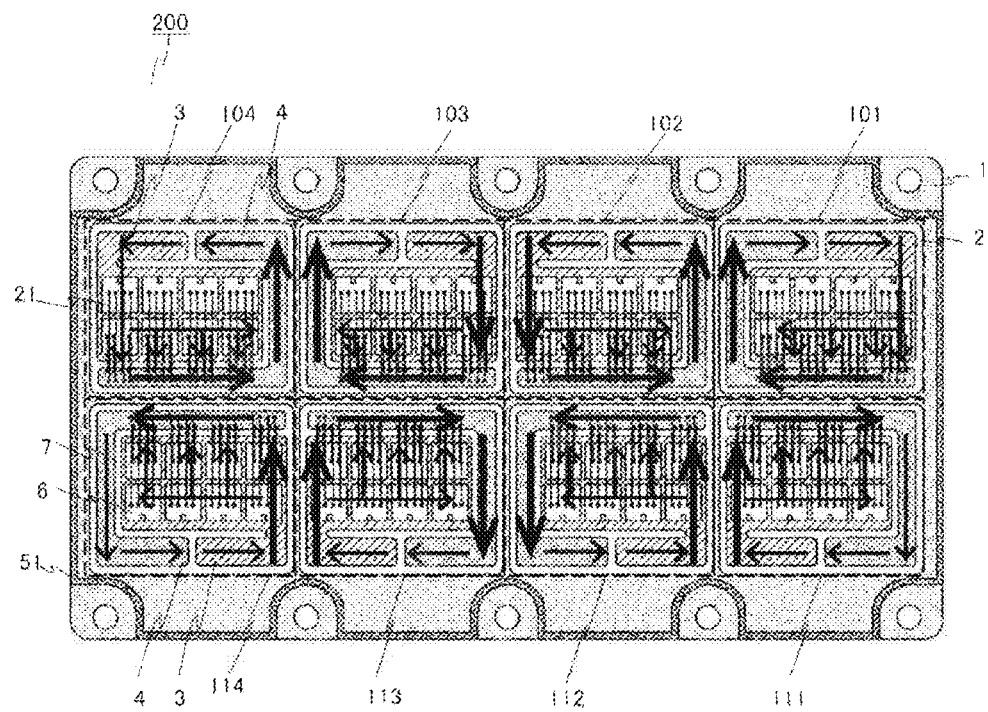
FIG. 15 is a diagram of current paths, at the time of commutation, through wiring patterns for example of the insulating substrate of the power semiconductor module in the second embodiment of the present invention.
Figure 16:
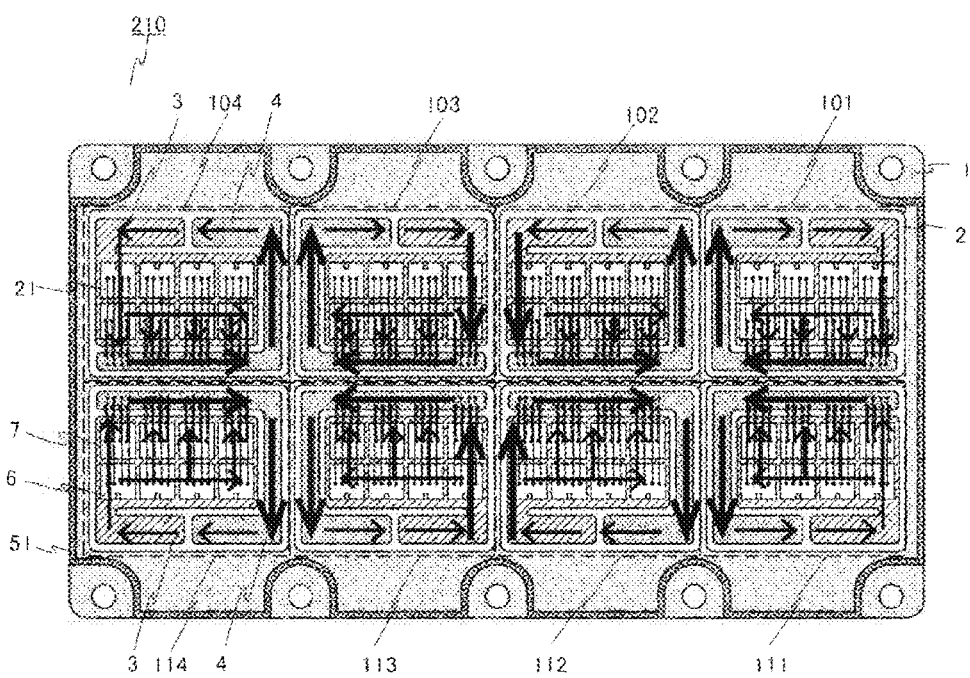
FIG. 16 is a diagram of current paths, at the time of commutation, through. wiring patterns for example of an insulating substrate of another power semiconductor module in the second embodiment of the present invention.

FIG. 15 is a diagram of current paths, at the time of commutation, through wiring patterns for example of the insulating substrate of the power semiconductor module in the second embodiment of the present invention. In FIG. 15, the current path (except for the main electrodes) in each of the positive arm and the negative arm of power semiconductor module 200 in the second embodiment is indicated by an arrow. FIG. 16 is a diagram of current paths, at the time of commutation, through. wiring patterns for example of an insulating substrate of another power semiconductor module in the second embodiment of the present invention. In FIG. 16, the direction of the current path (except for the main electrodes) in each of the positive arm and the negative arm of a power semiconductor module 210 in the second embodiment is indicated by an arrow, FIG. 16 shows another example configuration in which the arrangement in the negative arm is different from the example configuration shown in FIG. 15, Ire the configuration of FIG. 16, for positive blocks 101, 103/negative blocks 112, 114/positive blocks 102, 104/negative blocks 111,113, respective insulating substrates 2 configured to be identical to each other in terms of the wiring patterns are used. Namely, in the configuration of FIG. 16, insulating substrate 2 of the positive arm and adjacent insulating substrate 2 of the negative arm are also in mirror symmetry. The current paths shown in FIGS. 15 and 16 indicate current paths when large di/dt is generated at the time of commutation upon turn-on of self-arc-extinguishing type semiconductor elements 6 of the negative arm, On the contrary, in the current path at the time of commutation upon turn-on of self-arc-extinguishing type semiconductor elements 6 of the positive arm, current flows through self-arc-extinguishing type semiconductor elements 6 in the positive arm and current flows through freewheel diodes 7 in the negative arm, which is a difference from FIGS. 15 and 16, while the current path through the wiring patterns of insulating substrate 2 is substantially the same as that in FIGS. 15 and 16.

As to the direction of di/dt shown in FIG. 15, in each of the positive arm and the negative arm, there are regions each including adjacent source wiring patterns 4 on which the direction of di/dt is indicated by extra-thick arrows, In each of these regions, respective directions of the current in the adjacent source wiring patterns are identical to each other, the parasitic inductance of the current paths indicated by the extra-thick arrows increases, and thus a similar effect to the effect of suppressing the unbalance of current in the negative electrode side shown in FIG. 14 (a) can be obtained. Meanwhile, the current path indicated by the thick arrow on insulating substrate 2 of the positive arm and the current path indicated by the thick arrow in adjacent insulating substrate 2 of the negative arm are adjacent to each other (mirror symmetry), while the direction of flowing current of one of these insulating substrates is opposite to that of the other insulating substrate. Therefore, the parasitic inductance of the current paths indicated by the thick arrows is small. Accordingly, in both the positive arm and the negative arm, the parasitic inductance of the current paths indicated by the thick arrows is reduced, thus the parasitic inductance of the current paths indicated by the thick arrows is relatively smaller than the parasitic inductance of the current paths indicated by the extra-thick arrows and the variation of the source potential can thus be reduced. The unbalance of current flowing in self-arc-extinguishing type semiconductor elements 6 can therefore be suppressed.

In FIG. 16, since the wiring patterns in the positive arm and the negative arm are arranged in mirror symmetry, both the positive arm and the negative arm are capable of the same operation as that of the negative electrode side shown in FIG. 14 (a). Therefore, the current paths, which are indicated by the extra-thick arrows, of source wiring patterns 4 for self-arc-extinguishing type semiconductor elements 6 and freewheel diodes 7 do not have the effect of cancelling respective magnetic fluxes generated by di/dt of insulating substrates 2 adjacent to each other, and the parasitic inductance of the portion indicated by the extra-thick arrows is large. Accordingly, in both the positive arm and the negative arm, the parasitic inductance of the current path indicated by the extra-thick arrow is larger while the parasitic inductance of the current path indicated by the thick arrow is relatively smaller to thereby enable reduction of the variation of the source potential. It is therefore possible for the positive electrode side as well to achieve a similar effect to the effect of suppressing the unbalance of current flowing through self-arc-extinguishing type semiconductor elements 6. Moreover, since the positive arm and the negative arm are identical to each other in terms of arrangement of wiring patterns, respective directions of the thick arrows are identical to each other and the parasitic inductance of this portion indicated by the thick arrows increases. However, the amount of increase of the parasitic inductance of the portion indicated by the thick arrows is smaller than the amount of increase of the parasitic inductance of the portion indicated by the extra-thick arrows, which has no influence on the variation of the source potential. Further, since all opposite wiring patterns in the module are identical to each other, a uniform operation balance is obtained in the power semiconductor module, and a stable operation of the power semiconductor module can be performed. Thus, both the configurations of FIGS. 15 and 16 can produce the effect of suppressing the unbalance of current. In FIG. 16, as to the combination of insulating substrates 2 in positive arm and insulating substrates 2 in the negative arm, insulating substrates 2 in the negative arm is changed relative to FIG. 15. However, as long as the insulating substrates are arranged in mirror symmetry, similar effects can be obtained even when a change is made in the aforementioned combination of the insulating substrates in the positive arm and those in the negative arm.

In the present embodiment, although the drawings show four self-arc-extinguishing type semiconductor elements 6 mounted on insulating substrate 2 in parallel, the effects of the present invention are achieved as long as the number of parallel elements is two or more and the number of parallel elements is not limited to four. Moreover, although the drawings show four insulating substrates 2 in parallel, the effects of the present invention are achieved as long as the number of parallel insulating substrates 2 is two or more, and the number of parallel insulating substrates 2 is not limited to four.

Moreover, as to the shape of the main electrodes, as shown in FIG. 9, the positive electrode, the negative electrode, and the AC electrode are arranged in a layered form. Then, even when the module has one terminal per electrode, the positive electrode and the AC electrode are arranged in a layered form on the insulating substrate or the AC electrode and the negative electrode are arranged in a layered form on the insulating substrate, and further the positive electrode and the negative electrode are arranged in a layered form on the module. In this way, the inductance can be reduced.

In the power semiconductor module configured in the above-described manner, insulating substrates 2 on which different wiring patterns are mounted are arranged adjacent to each other so that the substrates are in mirror symmetry with each other. Therefore, adjacent wiring patterns can be made uniform in terms of current flowing in the wiring patterns. As a result of this, the unbalance of current between insulating substrates 2 and between self-arc-extinguishing type semiconductor elements 6 can be suppressed and the reliability of the power semiconductor module can be improved.

Moreover, the number of insulating substrates 2 may be any as long as insulating substrates 2 are arranged in mirror symmetry so that respective wiring patterns 4 are adjacent to each other. Regardless of the number of arranged insulating substrates 2, currents flowing in respective wiring patterns adjacent to each other can be made uniform. As a result of this, the unbalance of current between insulating substrates 2 and between self-arc-extinguishing type semiconductor elements 6 can be suppressed, and the reliability of the power semiconductor module can be improved. Further, two types of substrates on which different wiring patterns are arranged are used to arrange them in mirror symmetry. Therefore, the number of substrates forming the power semiconductor module can be reduced, and the cost of the power semiconductor module can be reduced while suppressing the unbalance of current between substrates and between power semiconductor elements.

Moreover, in the case of a metal substrate for which a resin insulating material is used, a plurality of different wiring patterns are arranged adjacently to each other on one substrate so that the wiring patterns are in mirror symmetry. Therefore, the number of substrates can be reduced, and the cost of the power semiconductor module can be reduced while suppressing the unbalance of current between substrates and between power semiconductor elements.

Third Embodiment

A third embodiment is different from the first and second embodiments in that respective source wiring patterns including mirror-symmetry portions on adjacent insulating substrates used in the first and second embodiments are connected by a bonding wire. Respective source wiring patterns including mirror-symmetry portions of adjacent insulating substrates can thus be connected by a bonding wire and made electrically conductive, to thereby reduce the inductance through increased conductive portions, in each of the mirror-symmetry portions, while suppressing the unbalance of current flowing in self-arc-extinguishing type semiconductor elements.

Figure 17:
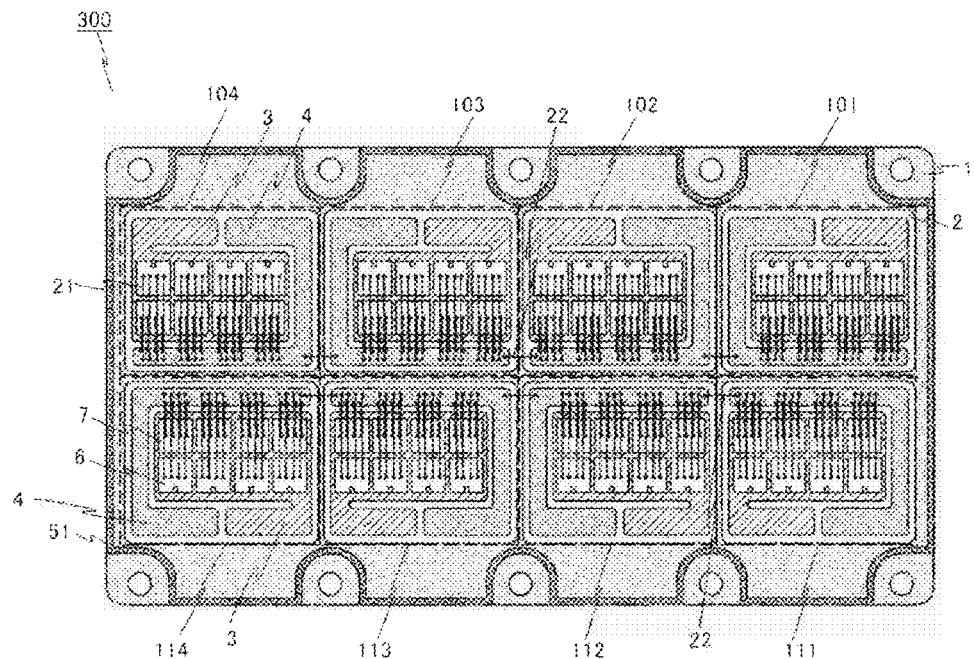
FIG. 17 is a top schematic diagram of a power semiconductor module in a third embodiment of the present invention, on which main electrodes are not shown.
Figure 18:
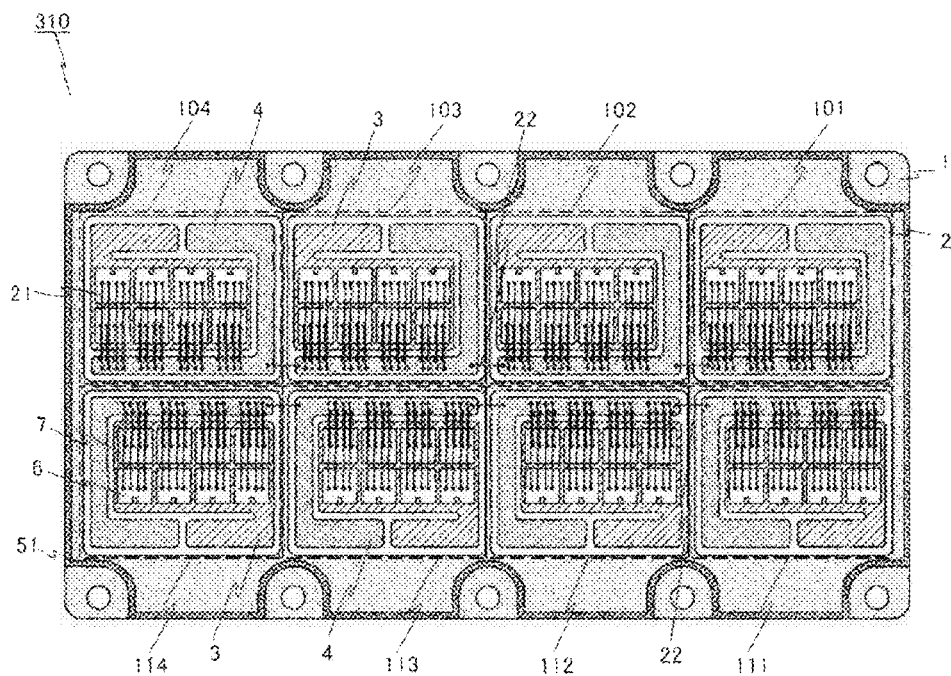
FIG. 18 is a top schematic diagram of a power semiconductor module in a conventional example, on which main electrodes are not shown.
Figure 19:
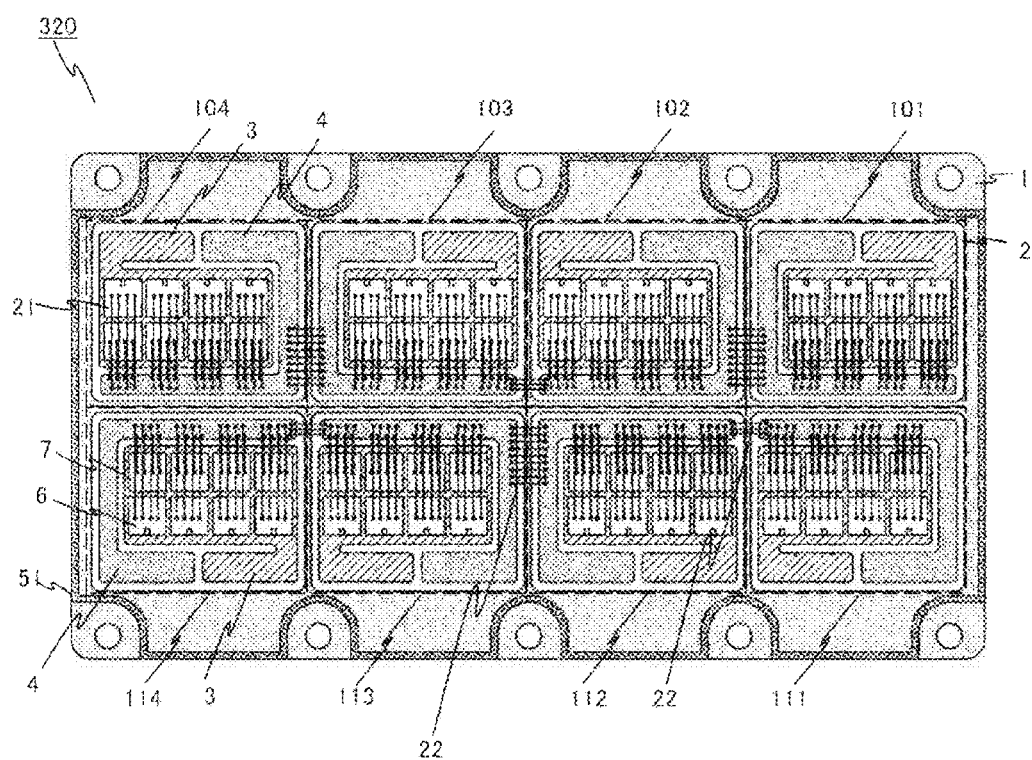
FIG. 19 is a top schematic diagram of another power semiconductor module in the third embodiment of the present invention, on which main electrodes are not shown.

FIG. 17 is a top schematic diagram of a power semiconductor module in a third embodiment of the present invention, on which main electrodes (positive electrode, negative electrode, and AC electrode) are not shown. In FIG. 17, a chip layout of self-arc-extinguishing type semiconductor elements 6 and freewheel diodes 7 for example is shown, without the main electrodes. The main electrodes are not shown in FIG. 17 because they have similar shapes to those in the second embodiment. FIG. 18 is a top schematic diagram of a power semiconductor module in a conventional example, on which main electrodes are not shown. In FIG. 18, a chip layout of self-arc-extinguishing type semiconductor elements 6 and freewheel diodes 7 for example is shown, without the main electrodes. In FIG. 18, insulating substrates are not arranged in minor symmetry. FIG. 19 is a top schematic diagram of another power semiconductor module in the third embodiment of the present invention, on which main electrodes (positive electrode, negative electrode, and AC electrode) are not shown, In FIG. 19, a chip layout of self-arc-extinguishing type semiconductor elements 6 and freewheel diodes 7 for example is shown, without the main electrodes. The main electrodes are not shown in FIG. 19 because they have similar shapes to those in the second embodiment.

In FIG. 17, a power semiconductor module 300 in the third embodiment includes a base plate 1, an insulating substrate 2 serving as a substrate, a drain (collector) wiring pattern 3, a source (emitter) wiring pattern 4, a ceramic insulating substrate 5, a self-arc-extinguishing type semiconductor element 6, a freewheel diode 7, a bonding wire 22, and a case 51.

In power semiconductor module 300 of the third embodiment, ceramic insulating substrate 5, which is an insulator to which metal foil is bonded by brazing or the like, is bonded with solder 9 to one surface of base plate 1 which is a metal heat radiator that radiates heat generated by self-arc-extinguishing type semiconductor element 6 and freewheel diode 7 which are components of power semiconductor module 300, To the surface of ceramic insulating substrate 5 opposite to the surface thereof to which base plate 1 is bonded, wiring patterns 3, 4 are bonded with metal foil by brazing or the like. Ceramic insulating substrate 5 to which metal foil is bonded and wiring patterns 3, 4 constitute insulating substrate 2. The material for the insulating substrate is not limited to the ceramic material and the insulating substrate may be a metal substrate for which a resin insulating material is used. In the case of the metal substrate for which a resin insulating material is used, a single metal substrate for example may be used and a plurality of wiring patterns may be formed in mirror symmetry on this metal substrate, instead of using a plurality of insulating substrates for positive and negative arms. Even such a metal substrate for which a resin insulating material is used can produce similar effects.

On the surface of drain (collector) wiring pattern 3 and source (emitter) wiring pattern 4 opposite to the surface thereof to which ceramic insulating substrate 5 is bonded, self-arc-extinguishing type semiconductor element 6 and freewheel diode 7 are bonded with solder 9, Further, respective source (emitter) wiring patterns 4 of adjacent insulating substrates 2 are connected by bonding wire 22 and made electrically conductive. Although the wire is used as a wiring member, it is not limited to wire and any of other bonding methods may be used.

In FIG. 18, a power semiconductor module 310 in the conventional example includes a base plate 1, an insulating substrate 2 serving as a substrate, a drain (collector) wiring pattern 3, a source (emitter) wiring pattern 4, a ceramic insulating substrate 5, a self-arc-extinguishing type semiconductor element 6, a freewheel diode 7, a bonding wire 22 serving as a wiring member, and a case 51. This power semiconductor module is different from power semiconductor module 300 in the third embodiment in that wiring patterns are not in mirror symmetry.

In power semiconductor module 200 of the second embodiment, the wiring patterns forming main circuitry of insulating substrates 2 are connected by the main electrodes only and connected in parallel. In order to reduce the wiring inductance, however, it is effective to increase the current paths. Therefore, in the third embodiment, parallel source (emitter) patterns 4 are connected by bonding wire 22 in order to increase the current paths. In such a case, respective wiring patterns of adjacent insulating substrates 2 are in mirror symmetry in the third embodiment. Therefore, respective potentials of the opposite ends of bonding wire 22 between insulating substrates 2 are identical to each other, and large current can be prevented from flowing to bonding wire 22. If insulating substrates 2 of a single type are provided and thus adjacent insulating substrates 2 are the same substrates as shown in FIG. 18, respective potentials of the opposite ends of bonding wire 22 may be different from each other, resulting in large current flowing to bonding wire 22. As a result of this, problems of heat generated from this bonding wire 22 and shortening of the power cycle life for example will occur. Therefore, in the third embodiment, because respective potentials of the opposite ends of bonding wire 22 are identical to each other, current hardly flows in bonding wire 22 when DC (Direct Current) is applied. As a result of this, in a period in which di/dt is large at the time of switching which may affect the wiring inductance, the inductance can be reduced, since electrically conductive portions are produced by bonding wire 22, without shortening of the power cycle life of bonding wire 22.

Further, more than one bonding wire 22 may be provided. Source wiring patterns 4 can be connected together by a plurality of bonding wires 22, to further reduce the impedance between patterns. An example of this is shown in FIG. 19.

In FIG. 19, a power semiconductor module 300 in the third embodiment includes a base plate 1, an insulating substrate 2 serving as a substrate, a drain (collector) wiring pattern 3, a source (emitter) wiring pattern 4, a ceramic insulating substrate 5, a self-arc-extinguishing type semiconductor element 6, a freewheel diode 7, a bonding wire 22, and a case 51.

A potential difference caused by flow of current in respective source wiring patterns 4 of insulating substrates is made less likely to generate by connecting, with a low impedance, respective source wiring patterns 4 of adjacent insulating substrates. The unbalance of current between insulating substrates can thus be suppressed. Although FIG. 19 shows four insulating substrates mounted in each of the positive electrode side and the negative electrode side, the number of insulating substrates may be two or three, or five or more, which still produces similar effects. Moreover, the combination of insulating substrates in the positive electrode side and insulating substrates in the negative electrode side may be any combination, other than that shown in FIG. 19, which still produces similar effects, as long as the wiring patterns are in mirror symmetry.

In the power semiconductor module configured in the above-described manner, insulating substrates 2 on which different wiring patterns are mounted are arranged adjacent to each other so that the substrates are in mirror symmetry with each other. Therefore, adjacent wiring patterns can be made uniform in terms of current flowing in the wiring patterns. As a result of this, the unbalance of current between insulating substrates 2 and between self-arc-extinguishing type semiconductor elements 6 can be suppressed and the reliability of the power semiconductor module can be improved.

Moreover, adjacent source wiring patterns 4 can be connected by bonding wire 22 and made electrically conductive to thereby increase current paths in power semiconductor module 300 and reduce the inductance.

Further, two types of substrates in which different wiring patterns are formed are used and arranged in mirror symmetry. Therefore, the number of substrates constituting the power semiconductor module can be reduced, and the cost of the power semiconductor module can be reduced while suppressing the unbalance of current between substrates and between power semiconductor elements.

Moreover, in the case of a metal substrate for which a resin insulating material is used, a plurality of different wiring patterns are arranged adjacently to each other on one substrate so that the wiring patterns are in mirror symmetry. Therefore, the number of substrates can be reduced, and the cost of the power semiconductor module can be reduced while suppressing the unbalance of current between substrates and between power semiconductor elements.

REFERENCE SIGNS LIST 1 base plate; 2 insulating substrate; 3 drain (collector) wiring pattern; 4 source (emitter) wiring pattern; 5 ceramic insulating substrate; 6 self-arc-extinguishing type semiconductor element; 7 freewheel diode; 8 gate resistor; 9 bonding material; 10 positive electrode; 11 negative electrode; 12 AC electrode; 13G positive electrode gate; 13E positive electrode control source; 14G negative electrode gate; 14E negative electrode control source; 21, 22 bonding wire; 40 positive electrode terminal; 41 negative electrode terminal; 42 AC terminal; 50 sealing material; 51 case; 52 cover; 53 nut; 100, 110, 200, 210, 300, 310, 320 power semiconductor module; 101, 102, 103, 104 positive electrode block; 111, 112, 113, 114 negative electrode block

The invention claimed is:

1. A power semiconductor module comprising:
a plurality of positive-negative arms including a plurality of positive arms and a plurality of negative arms, each of the plurality of positive-negative arms including a positive arm and a negative arm that are formed by series connection of self-arc-extinguishing type semiconductor elements, the positive arm and the negative arm being connected at a series connection point between the self-arc-extinguishing type semiconductor elements;
a positive-side electrode, a negative-side electrode, and an AC electrode connected to the plurality of positive-negative arms; and
a substrate on which a plurality of wiring patterns are formed, the wiring patterns connecting the self-arc-extinguishing type semiconductor elements of the plurality of positive-negative arms to the positive-side electrode, the negative-side electrode, and the AC electrode,
the plurality of wiring patterns including a pair of adjacent wiring patterns, the adjacent wiring patterns being included in respective adjacent positive arms or respective adjacent negative arms, the adjacent positive arms being a pair of adjacent positive arms included in the plurality of positive arms, the adjacent negative arms being a pair of adjacent negative arms included in the plurality of negative arms, respective directions of current flowing in the adjacent wiring patterns being identical to each other, and one of the adjacent wiring patterns being arranged in mirror symmetry with the other of the adjacent wiring patterns about a line of mirror symmetry.

2. The power semiconductor module according to claim 1, wherein
the plurality of positive arms include respective wiring patterns of the plurality of wiring patterns, the plurality of negative arms include respective wiring patterns of the plurality of wiring patterns, the wiring patterns of the plurality of positive arms are connected to the positive-side electrode and the AC electrode, and the wiring patterns of the plurality of negative arms are connected to the negative-side electrode and the AC electrode.

3. The power semiconductor module according to claim 1, wherein
the plurality of wiring patterns of the plurality of positive-negative arms include a first wiring pattern and a second wiring pattern, and
the first wiring pattern and the second wiring pattern each include a parallel portion in which current through the self-arc-extinguishing type semiconductor elements flows, and the parallel portion is located adjacently to the line of mirror symmetry and extends in parallel with the line of mirror symmetry.

4. The power semiconductor module according to claim 3, wherein
a plurality of the self-arc-extinguishing type semiconductor elements are disposed on a corresponding one of the wiring patterns and arranged in a direction perpendicular to the line of mirror symmetry,
the second wiring pattern is connected via a wiring member to the self-arc-extinguishing type semiconductor elements,
the first wiring pattern and the second wiring pattern each include a perpendicular portion extending perpendicularly to the line of mirror symmetry, and
in the plurality of positive-negative arms, current in the parallel portion of the first wiring pattern and current in the parallel portion of the second wiring pattern flow in respective directions opposite to each other.

5. The power semiconductor module according to claim 4, wherein one of respective perpendicular portions of the first wiring pattern and the second wiring pattern is connected to a positive pole of the self-arc-extinguishing type semiconductor elements, and
the other of respective perpendicular portions of the first wiring pattern and the second wiring pattern is connected to a negative pole of the self-arc-extinguishing type semiconductor elements.

6. The power semiconductor module according to claim 5, wherein.
- one of the first wiring pattern and the second wiring pattern is connected to the positive-side electrode or the negative-side electrode,
- the other of the first wiring pattern and the second wiring pattern is connected to the AC electrode, and
- a position where one of the first wiring pattern and the second wiring pattern is connected to the positive-side electrode or the negative-side electrode is located close to a position where the other of the first wiring pattern and the second wiring pattern is connected to the AC electrode.

7. The power semiconductor module according to claim 4, wherein
- the plurality of positive arms and the plurality of negative arras include a pair of a positive arm and a negative arm which are arranged in a direction parallel with the line of mirror symmetry, and the perpendicular portion of the second wiring pattern in one of the positive arm and the negative arm and the perpendicular portion of the second wiring pattern in the other of the positive arm. and the negative arm are adjacent to each other in a direction parallel with the line of mirror symmetry, and
- current in the perpendicular portion of the second wiring pattern in the one of the positive arm and the negative arm and current in the perpendicular portion of the second wiring pattern in the other of the positive arm and the negative arm flow in respective directions opposite to each other.

8. The power semiconductor module according to claim 4, wherein
- the plurality of positive arms and the plurality of negative arms include a pair of a positive arm and a negative arm which are arranged in a direction parallel with the line of mirror symmetry, and the perpendicular portion of the second wiring pattern in one of the positive arm and the negative arm and the perpendicular portion of the second wiring pattern in the other of the positive arm and the negative arm are adjacent to each other in a direction parallel with the line of mirror symmetry, and
- current in the perpendicular portion of the second wiring pattern in the one of the positive arm and the negative arm and current in the perpendicular portion of the second wiring pattern in the other of the positive arm and the negative arm flow in the same direction.

9. The power semiconductor module according to claim 4, wherein
- the plurality of positive-negative arms include a pair of adjacent positive or negative arms which are adjacent to each other with the line of mirror symmetry interposed therebetween, and the perpendicular portion included in the second wiring pattern of one of the adjacent positive or negative arms and the perpendicular portion included in the second wiring pattern in the other of the adjacent positive or negative arms are electrically connected by the wiring member.

10. The power semiconductor module according to claim 9, wherein
- the wiring member electrically connecting the perpendicular portions is a plurality of bonding wires.

11. The power semiconductor module according to claim 1, wherein
- the substrate includes a first substrate and a second substrate adjacent to each other with the line of mirror symmetry located between the first substrate and the second substrate, and the first substrate and the second substrate are arranged so that respective wiring patterns formed on the first substrate and the second substrate are in mirror symmetry.

12. The power semiconductor module according to claim 1, further comprising a diode connected in anti-parallel to the self-arc-extinguishing type semiconductor element and bonded to the wiring pattern, wherein
- the positive arm and the negative arm are each formed by series connection of parallel circuits each including the self-arc-extinguishing type semiconductor element and the diode.

13. The power semiconductor module according to claim 12, wherein
- the diode is formed of a wide gap semiconductor that is wider in band gap than silicon.

14. The power semiconductor module according to claim 1, wherein
- the self-arc-extinguishing type semiconductor element is formed of a wide gap semiconductor that is wider in band gap than silicon.

15. The power semiconductor module according to claim 13, wherein
- the wide gap semiconductor is one of silicon carbide, a gallium nitride material, and diamond.

16. The power semiconductor module according to claim 1, wherein
- the positive arms are four or more positive arms, and the negative arms are four or more negative arms.

17. The power semiconductor module according to claim 1, wherein
- the substrate includes a plurality of substrates, and the plurality of substrates are arranged so that respective wiring patterns formed on adjacent substrates of the plurality o substrates are in mirror symmetry.

* * * * *